United States Patent
Chen et al.

(10) Patent No.: US 12,532,509 B2
(45) Date of Patent: Jan. 20, 2026

(54) INTEGRATED CIRCUIT WITH BACKSIDE TRENCH FOR NANOSHEET REMOVAL

(71) Applicant: Taiwan Semiconductor Manufacturing Co., Ltd., Hsinchu (TW)

(72) Inventors: Chun-Yuan Chen, Hsinchu (TW); Li-Zhen Yu, Hsinchu (TW); Huan-Chieh Su, Hsinchu (TW); Cheng-Chi Chuang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 789 days.

(21) Appl. No.: 17/693,203

(22) Filed: Mar. 11, 2022

(65) Prior Publication Data

US 2023/0137307 A1 May 4, 2023

Related U.S. Application Data

(60) Provisional application No. 63/275,345, filed on Nov. 3, 2021.

(51) Int. Cl.
| | |
|---|---|
| H10D 30/67 | (2025.01) |
| H10D 62/10 | (2025.01) |
| H10D 84/01 | (2025.01) |
| H10D 84/03 | (2025.01) |
| H10D 84/83 | (2025.01) |

(52) U.S. Cl.
CPC ..... *H10D 30/6735* (2025.01); *H10D 30/6757* (2025.01); *H10D 62/118* (2025.01); *H10D 84/0128* (2025.01); *H10D 84/013* (2025.01); *H10D 84/038* (2025.01); *H10D 84/83* (2025.01)

(58) Field of Classification Search
CPC ................. H10D 30/6735; H10D 30/6757
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 12,002,810 B2 * | 6/2024 | Crum ..................... H01L 27/088 |
| 2019/0067113 A1 * | 2/2019 | Chiang ................ H10D 64/518 |
| 2019/0229218 A1 * | 7/2019 | Leobandung .......... H10D 30/62 |
| 2020/0105757 A1 * | 4/2020 | Kang ................... H10D 30/024 |
| 2020/0168715 A1 * | 5/2020 | Wu ..................... H01L 21/30604 |

(Continued)

*Primary Examiner* — Davienne N Monbleau
*Assistant Examiner* — Heim Kirin Grewal
(74) *Attorney, Agent, or Firm* — Seed IP Law Group

(57) ABSTRACT

An integrated circuit includes a first nanosheet transistor and a second nanosheet transistor on a substrate. The integrated circuit includes a backside trench through the substrate that removes a lowest semiconductor nanosheet of the first nanosheet transistor while leaving the lowest semiconductor nanosheet of the second nanosheet transistor. The backside trench is filled with a dielectric material.

20 Claims, 19 Drawing Sheets

(56) References Cited

U.S. PATENT DOCUMENTS

2021/0202478 A1\* 7/2021 Guha .................... H01L 27/088
2021/0202696 A1\* 7/2021 Guha ................... H10D 86/215
2021/0313317 A1\* 10/2021 Tsao ................. H01L 29/66439

\* cited by examiner

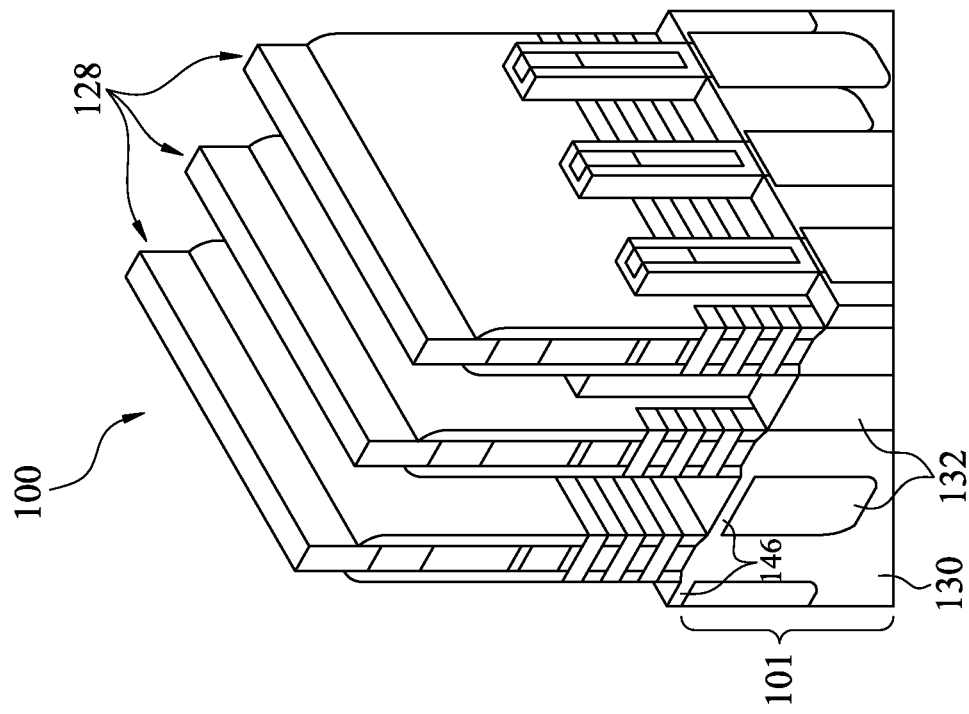
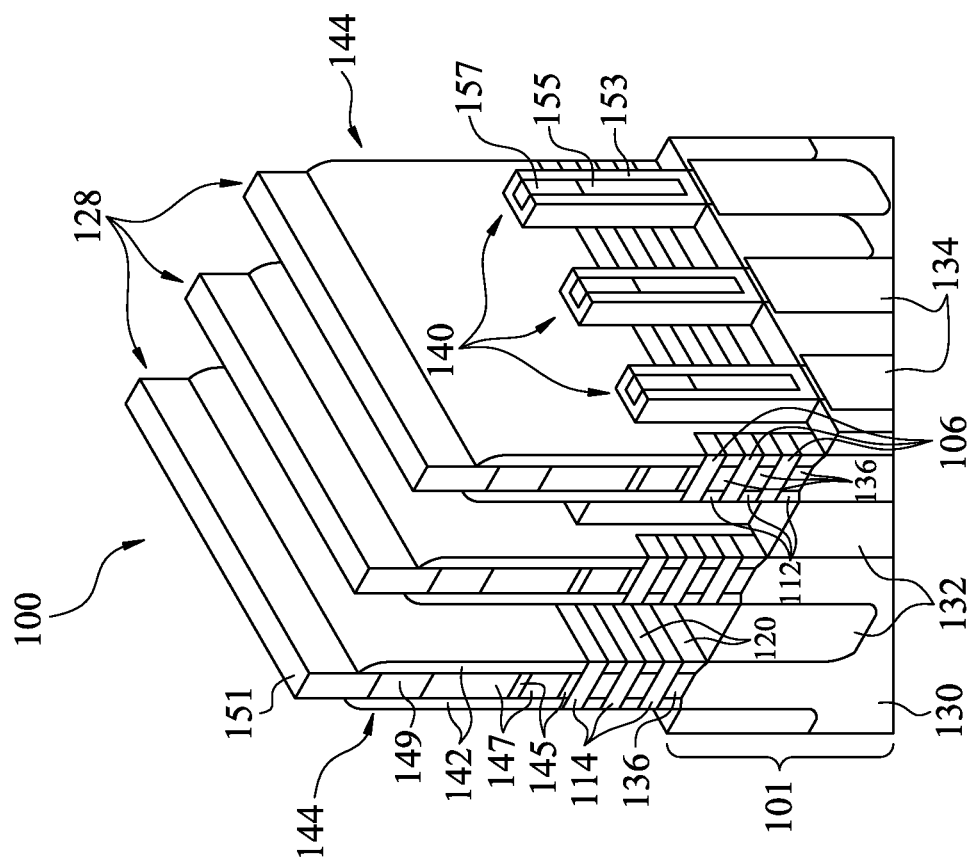
Fig. 2A
Fig. 2B

INTEGRATED CIRCUIT WITH BACKSIDE TRENCH FOR NANOSHEET REMOVAL

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Nanosheet transistors can assist in increasing computing power because the nanosheet transistors can be very small and can have improved functionality over convention transistors. A nanosheet transistor may include a plurality of semiconductor nanosheets (e.g. nanowires, nanosheets, etc.) that act as the channel regions for a transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
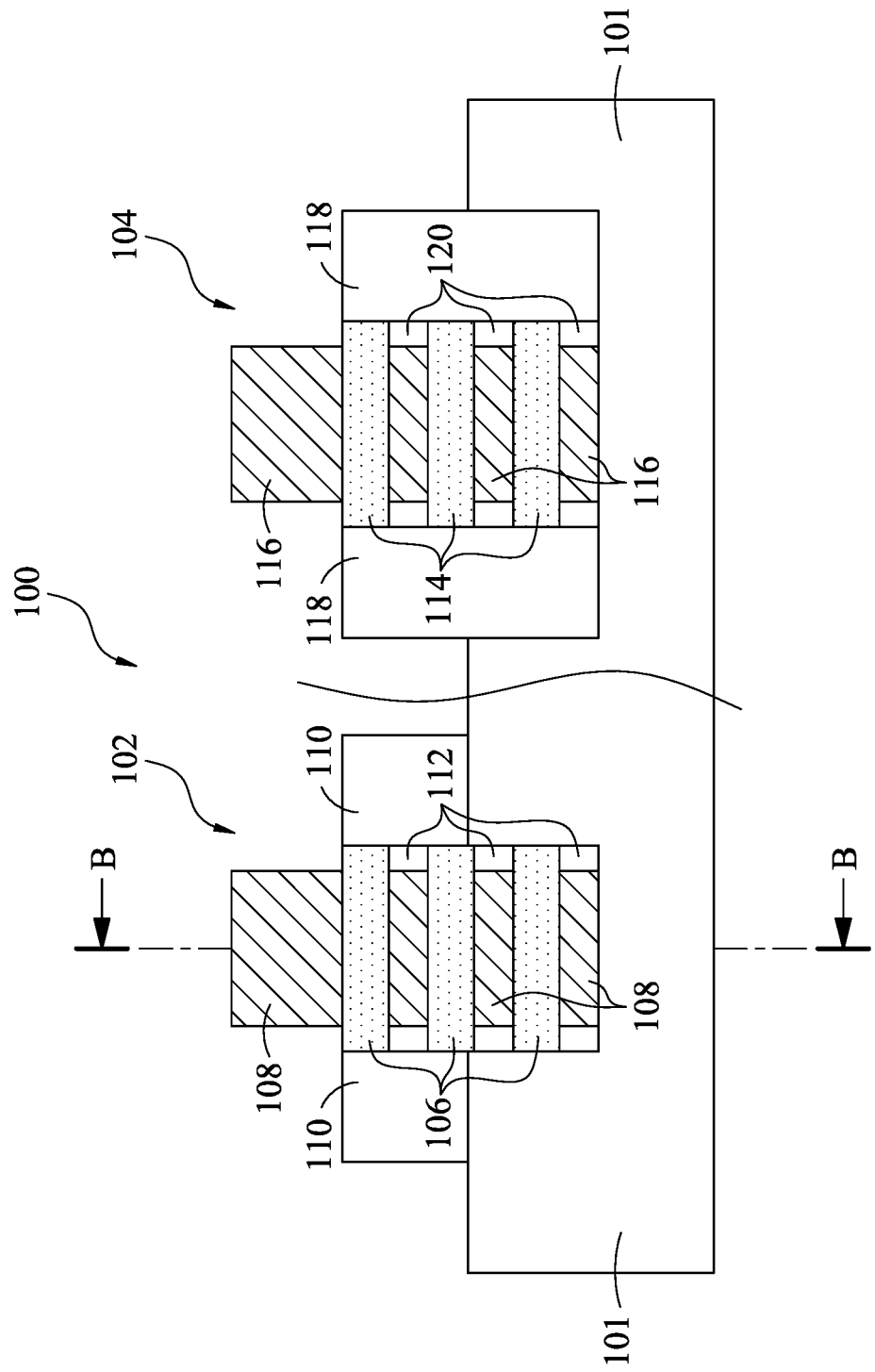
FIGS. 1A-1F are simplified cross-sectional view of an integrated circuit 100, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with a first gate all around nanosheet transistor and a second gate all around nanosheet transistor having differing numbers of nanosheets from each other. During processing, the nanosheet transistors each initially have a same number of nanosheets. The source/drain regions of the first transistor are initially formed so that they contact only the upper nanosheets of the first transistor without contacting the lowest nanosheet of the first transistor. The source/drain regions of the second transistor contact all of the nanosheets of the second transistor. Rather than allow a floating nanosheet below the first transistor, a backside trench is etched through a substrate below the first transistor. The lowest nanosheet of the first transistor is removed through the backside trench and replaced with a dielectric material.

By removing the lowest nanosheet of the first transistor, transistor performance is improved. This is because the lowest unused nanosheet of the first transistor introduces parasitic capacitance and the potential for short-circuiting with backside vias that contact the source/drain regions of the first transistor, if the lowest unused nanosheet is not removed. By removing the lowest unused nanosheet of the first transistor, the parasitic capacitance is reduced and the possibility of short circuits with backside vias is also reduced. The result is first and second transistors that have different numbers of active nanosheets without suffering performance drawbacks. Device performance and wafer yield are improved.

FIG. 1A is a simplified cross-sectional view of an integrated circuit 100 at an intermediate stage of processing, in accordance with some embodiments. The integrated circuit 100 includes a substrate 101. The integrated circuit also includes a first transistor 102 and a second transistor 104 above the substrate 101.

In FIG. 1A, front end processing of the integrated circuit 100 is substantially complete. The view of FIG. 1A a simplified in the sense that various structures that may, in practice, be present, are not shown. For example, interlevel dielectric layers, semiconductor cap layers, spacer layers, hybrid fins, gate contacts, source/drain contacts, and various other structures are not shown. This is to more easily facilitate a clear understanding of concepts of embodiments of the present disclosure.

The first transistor 102 includes a plurality of semiconductor nanosheets 106. The semiconductor nanosheets 106 are discrete semiconductor nanosheets that act as stacked channel regions of the first transistor 102. The semiconductor nanosheets 106 can include nanosheets, nanowires, or other structures. The semiconductor nanosheets 106 can include silicon, silicon germanium, or other semiconductor materials. The semiconductor nanosheets 106 can have a thickness between 2 nm and 10 nm. Other shapes, materials, and processes of the semiconductor nanosheets 106 can be utilized without departing from the scope of the present disclosure. As used herein, the terms "lower than", "below", "above", "higher than", and other similar terms may be understood to refer to an orientation in which the substrate 101 is below the semiconductor nanosheets 106, regardless of how the integrated circuit 100 may be positioned in a product after packaging, unless context clearly dictates otherwise.

The first transistor 102 includes a gate electrode 108. The gate electrode 108 surrounds the semiconductor nanosheets 106. The gate electrode 108 can include multiple layers of metal or other types of conductive materials. For example, the gate electrode 108 can include one or more layers of tungsten, aluminum, titanium, copper, titanium nitride, or tantalum nitride. The gate electrode 108 can include other materials without departing from the scope of the present disclosure. Though not shown in FIG. 1A, a thin gate dielectric separates the semiconductor nanosheets 106 from the gate electrode 108. The gate dielectric wraps around the outer surface of the semiconductor nanosheets 106 between the semiconductor nanosheets 106 and the gate electrode 108.

The first transistor 102 includes source/drain regions 110. There is a respective source/drain region 110 on each end of the semiconductor nanosheets 106. The left source/drain region 110 physically connects to the left ends of the semiconductor nanosheets 106. The right source/drain region 110 physically connects to the right ends of the semiconductor nanosheets 106. The source/drain regions 110 can include semiconductor material such as silicon or silicon germanium doped with N type dopants species or P type dopant species depending on the type of the transistor 102. Notably, the source/drain regions 110 are only directly connected to the top two semiconductor nanosheets 106. The source/drain regions 110 are not directly connected to the bottom semiconductor nanosheet 106. The reason for this will be described further below.

The first transistor 102 includes inner spacers 112. The inner spacers 112 are dielectric regions that physically separate the gate electrode 108 from the source/drain regions 110. In this way, the source/drain regions 110 cannot become shorted with the gate electrode 108. The inner spacers 112 can include silicon nitride, SiCN, SiOCN, or other suitable dielectric materials.

The first transistor 102 can be operated by applying a voltage to the gate electrode 108. This can prevent or enable current to flow between the source/drain regions 110 of the transistor 102 through the semiconductor nanosheets 106. Accordingly, the semiconductor nanosheets 106 correspond to the channel regions of the first transistor 102. Because the gate electrode 108 surrounds the semiconductor nanosheets 106, the first transistor 102 can be termed a gate all around transistor.

The second transistor 104 includes a plurality of semiconductor nanosheets 106. The semiconductor nanosheets 114 are discrete semiconductor structures that act as channel regions of the second transistor 104. The semiconductor nanosheets 114 can include nanosheets, nanowires, or other structures. The semiconductor nanosheets 114 can include silicon, silicon germanium, or other semiconductor materials. The semiconductor nanosheets 114 can have a thickness between 2 nm and 10 nm. Other shapes, materials, and processes of the semiconductor nanosheets 114 can be utilized without departing from the scope of the present disclosure. The semiconductor nanosheets 114 and the semiconductor nanosheets 106 may be substantially identical to each other.

The second transistor 104 includes a gate electrode 116. The gate electrode 116 surrounds the semiconductor nanosheets 114. The gate electrode 116 can include multiple layers of metal or other types of conductive materials. For example, the gate electrode 116 can include one or more layers of tungsten, aluminum, titanium, copper, titanium nitride, or tantalum nitride. The gate electrode 116 can include other materials without departing from the scope of the present disclosure. Though not shown in FIG. 1A, a thin gate dielectric separates the semiconductor nanosheets 114 from the gate electrode 116. The gate dielectric wraps around the outer surface of the semiconductor nanosheets 114 between the semiconductor nanosheets 114 and the gate electrode 116.

The second transistor 104 includes source/drain regions 118. There is a respective source/drain region 118 on each end of the semiconductor nanosheets 114. The left source/drain region 118 physically connects to the left ends of the semiconductor nanosheets 114. The right source/drain region 118 physically connects to the right ends of the semiconductor nanosheets 114. The source/drain regions 118 can include semiconductor material such as silicon or silicon germanium doped with N type dopants species or P type dopant species depending on the type of the transistor 102. Notably, the source/drain regions 118 are directly connected to the all three semiconductor nanosheets 114, including a bottom most semiconductor nanosheet 114.

The second transistor 104 includes inner spacers 120. The inner spacers 120 are dielectric regions that physically separate the gate electrode 116 from the source/drain regions 118. In this way, the source/drain regions 118 cannot become shorted with the gate electrode 116. The inner spacers 120 can include silicon nitride, SiCN, SiOCN, or other suitable dielectric materials.

The second transistor 104 can be operated by applying a voltage to the gate electrode 116. This can prevent or enable current to flow between the source/drain regions 118 of the transistor 104 through the semiconductor nanosheets 106. Accordingly, the semiconductor nanosheets 114 correspond to the channel regions of the second transistor 104. Because the gate electrode 116 surrounds the semiconductor nanosheets 114, the second transistor 104 can be termed a gate all around transistor.

The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the gate all around structure.

As can be seen in FIG. 1A, the first transistor 102 has only two semiconductor nanosheets 106 connected to the source and drain regions 110, while the second transistor 104 has three semiconductor nanosheets 114 connected to the source/drain regions 118. The reason for this is because it may be beneficial to have transistors with differing electrical characteristics. For example, the transconductance of the transistor 104 is higher than the transconductance of the transistor 102. The transconductance corresponds to how much the channel current changes with changes in gate to source voltage. The channel current corresponds to the total current flowing through all of the semiconductor nanosheets 106. In FIG. 1A, the difference is effected by ensuring that the source/drain regions 110 begin at a higher level than do the source/drain regions 118.

However, in the state shown in FIG. 1A, the transistor 102 suffers from various drawbacks. For example, it is possible that leakage currents will flow from the bottom nanosheet 106 into the substrate 101 or to the source/drain regions 110. Additionally, the disconnected bottom semiconductor nanosheet 106 adds a parasitic capacitance to the transistor 102. This can affect switching speeds and other performance characteristics of the transistor 102. Furthermore, though not shown in FIG. 1A, there may be backside conductive vias that extend through the substrate 101 to contact the source/drain regions 110. It is possible that the bottom nanosheet 106 can short-circuit with the backside vias, thereby effectively rendering the transistor 102 the same as the transistor 104.

Figure 1B:
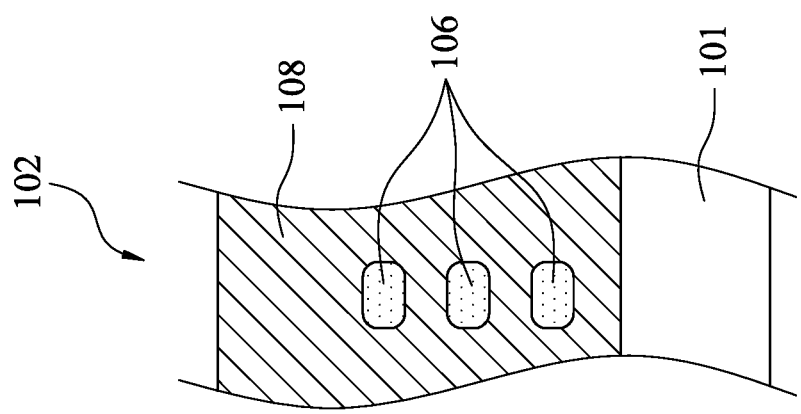

FIG. 1B is a cross-sectional view of a portion of the transistor 102 of FIG. 1A, taken along cut lines B. The view of FIG. 1B illustrates how the gate electrode 108 surrounds the semiconductor nanosheets 106. The gate electrode 108 effectively has three gaps, slots, or channels through which the semiconductor nanosheets 106 extend between the source/drain regions 110 (not visible in the view of FIG. 1B). Though not shown in FIG. 1B, as described previously, in practice a thin gate dielectric including one or more dielectric layers is positioned between the semiconductor nanosheets 106 and the gate electrode 108. The gate dielectric can include an interfacial layer and a high K dielectric layer having a total thickness less than 2 nm.

Figure 1C:
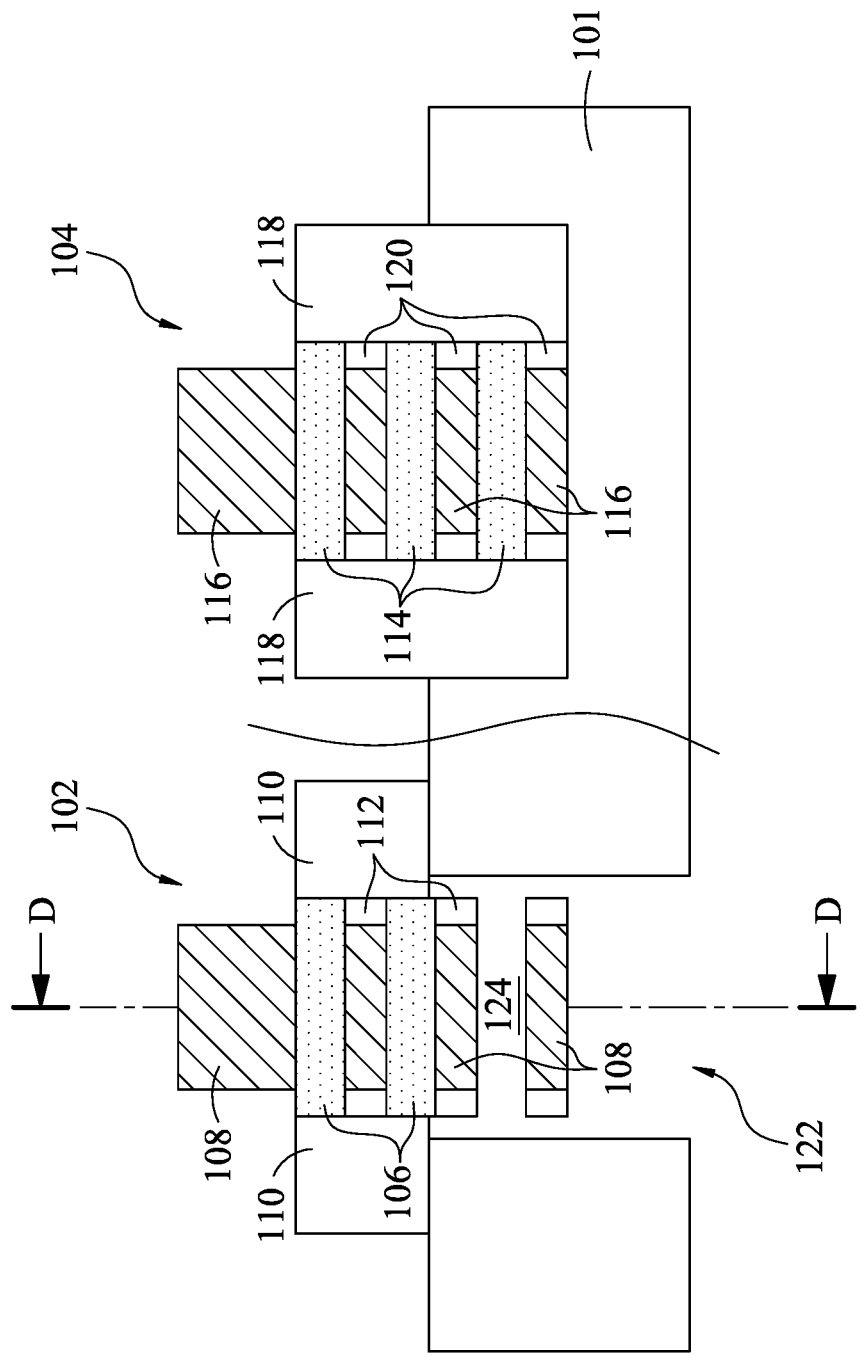

In FIG. 1C, a backside trench 122 has been formed in the substrate 101. The backside trench is formed by flipping the integrated circuit, or rather by flipping the wafer in which the integrated circuit is being formed, and then etching the trench 122 starting from the bottom surface (which faces upward during the etching process) of the substrate. FIG. 1C does not illustrate the process of flipping and etching. The surface of the substrate 101 that faces downward in FIG. 1C faces upward during the process of etching the trench 122. The process for etching the trench 122 can include a wet etch, a dry etch, a combination of wet and dry etches, or other suitable etching processes.

In FIG. 1C, the lowest semiconductor nanosheet 106 of the transistor 102 has been removed. There is a void 124 or aperture in the place where the semiconductor nanosheet 106 previously was situated. In some cases, the lowest semiconductor nanosheet 106 can be removed in a separate etching process from the etching process that etches the trench 122. In some cases, the lowest semiconductor nanosheet 106 can be removed in a same etching process as the etching process that etches the trench 122.

Figure 1D:
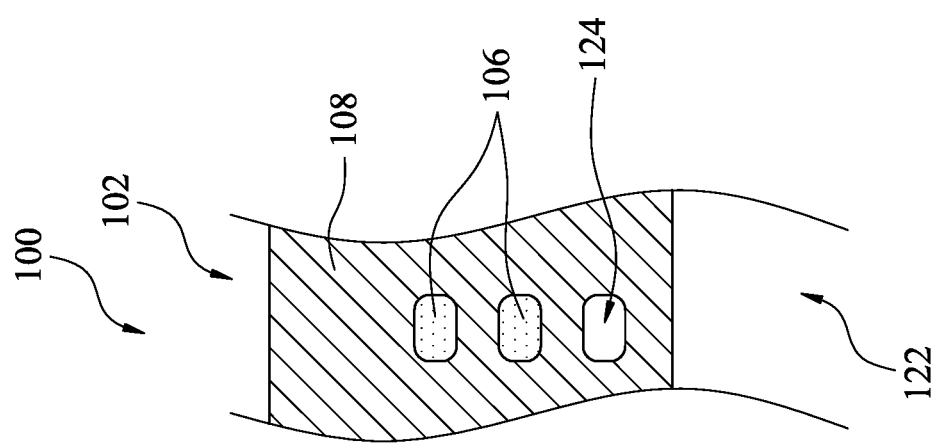

FIG. 1D is a cross-sectional view of a portion of the transistor 102 of FIG. 1C, taken along cut lines D. The view of FIG. 1D illustrates that there is a void 124 in the lowest channel opening in the gate electrode 108 due to the removal of the lowest semiconductor nanosheet 106.

Figure 1E:
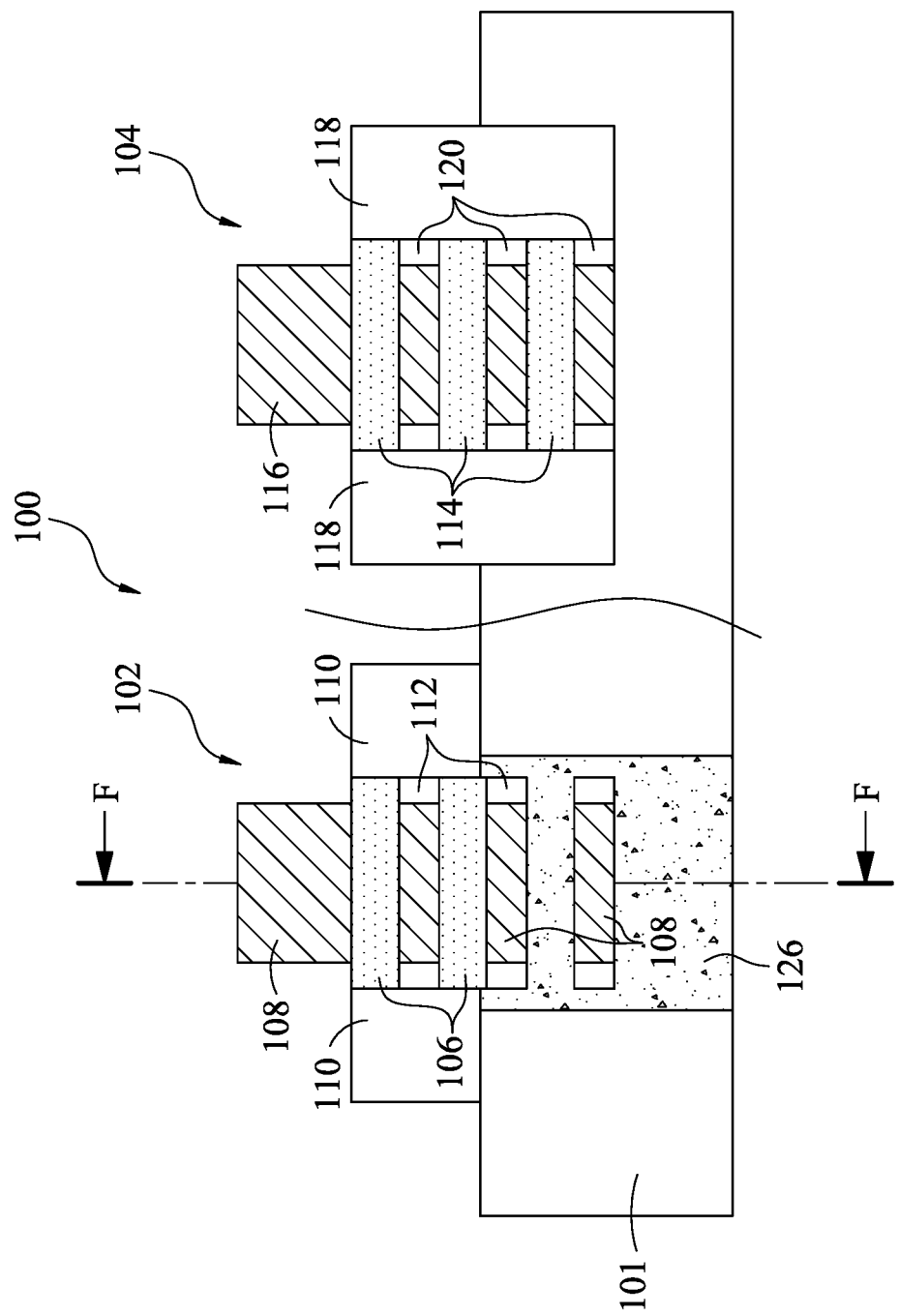

In FIG. 1E, the backside trench 122 has been filled with a dielectric material 126. The dielectric material 126 can include a low K dielectric material. The dielectric material 126 can include SiOCN, SiN, silicon oxide, or other suitable dielectric materials. The dielectric material 126 can be deposited with a CVD process, an ALD process, a PVD process, or other suitable dielectric processes. The dielectric material 126 fills the trench 122 also the void 124 that was formed by removal of the lowest semiconductor nanosheet 106 of the transistor 102. Other processes and materials can be utilized for the dielectric material 126 without departing from the scope of the present disclosure. Deposition of the dielectric material 126 results in the formation of a dielectric fin structure below the transistor 102.

With the dielectric 126 replacing the lowest semiconductor nanosheet 106, the transistor 102 includes two semiconductor nanosheets 106 while the transistor 104 includes three semiconductor nanosheets 114. The result is that the transistors 102 and 104 have different electrical characteristics. For example, the transistor 104 has a higher transconductance and may conduct a higher total current when turned on than does the transistor 102. The transistor 102 does not suffer from the drawbacks of having a floating semiconductor nanosheet 106, such as leakage, parasitic capacitance, and possible short circuits.

Figure 1F:
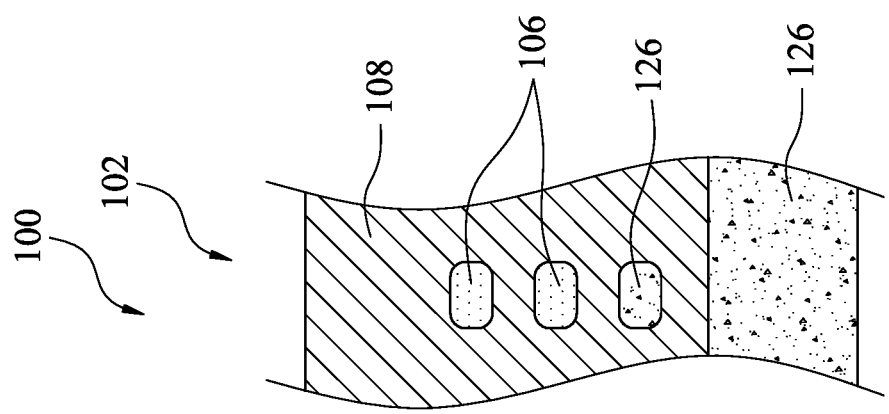

FIG. 1F is a cross-sectional view of a portion of the transistor 102 of FIG. 1E, taken along cut lines F. The view of FIG. 1F illustrates that the void 124 in the aperture in the gate electrode 108 is now filled with the dielectric material 126. Accordingly, the gate electrode 108 surrounds a portion of the dielectric fin made of the dielectric material 126.

Figure 2D:
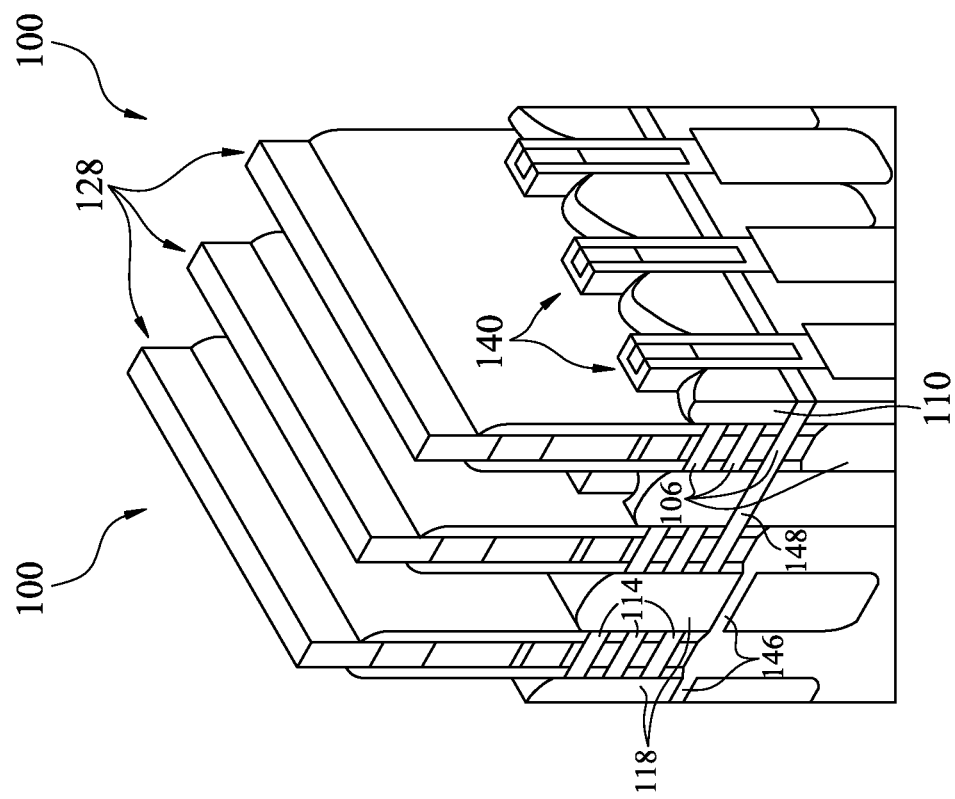
FIGS. 2A-2T are perspective and cross-sectional views of an integrated circuit at various stages of processing, in accordance with some embodiments.
Figure 2C:
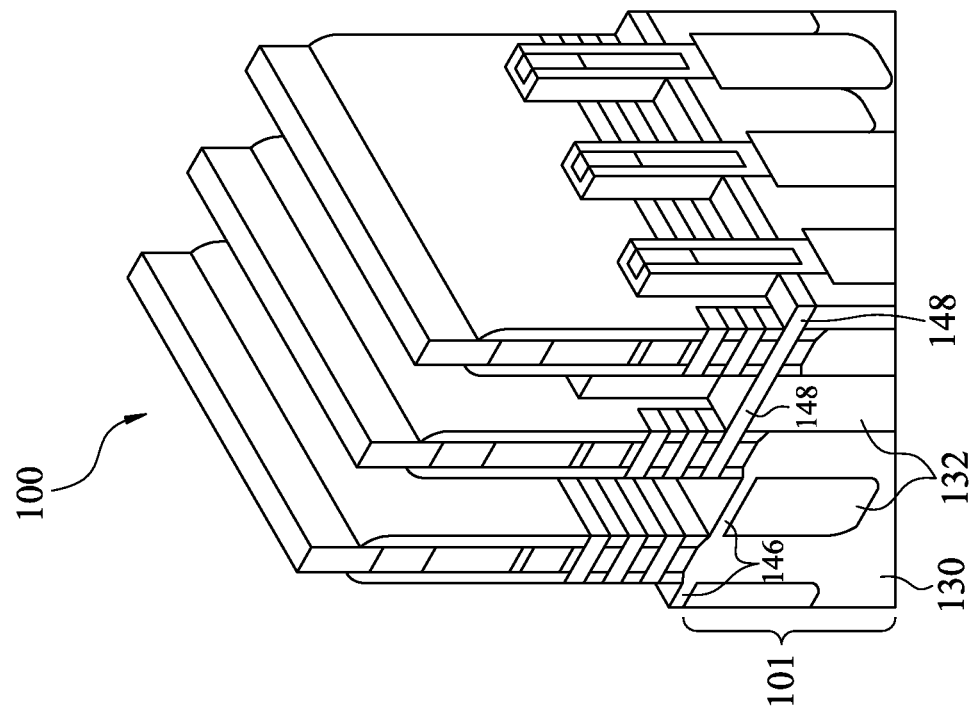
Figure 2F:
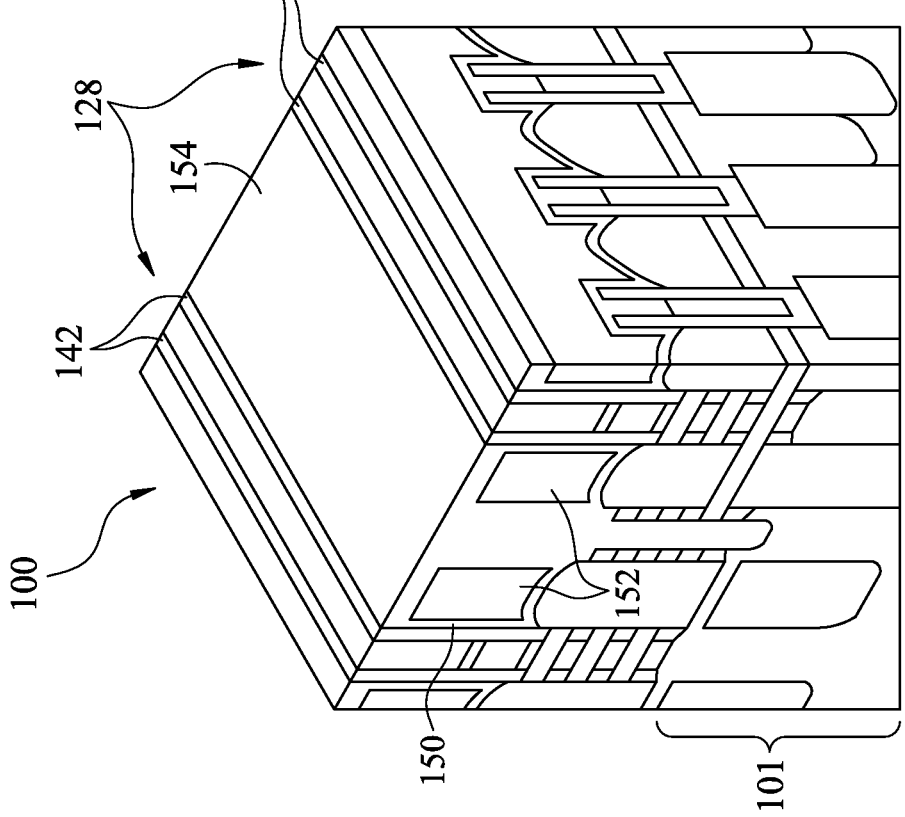
Figure 2E:
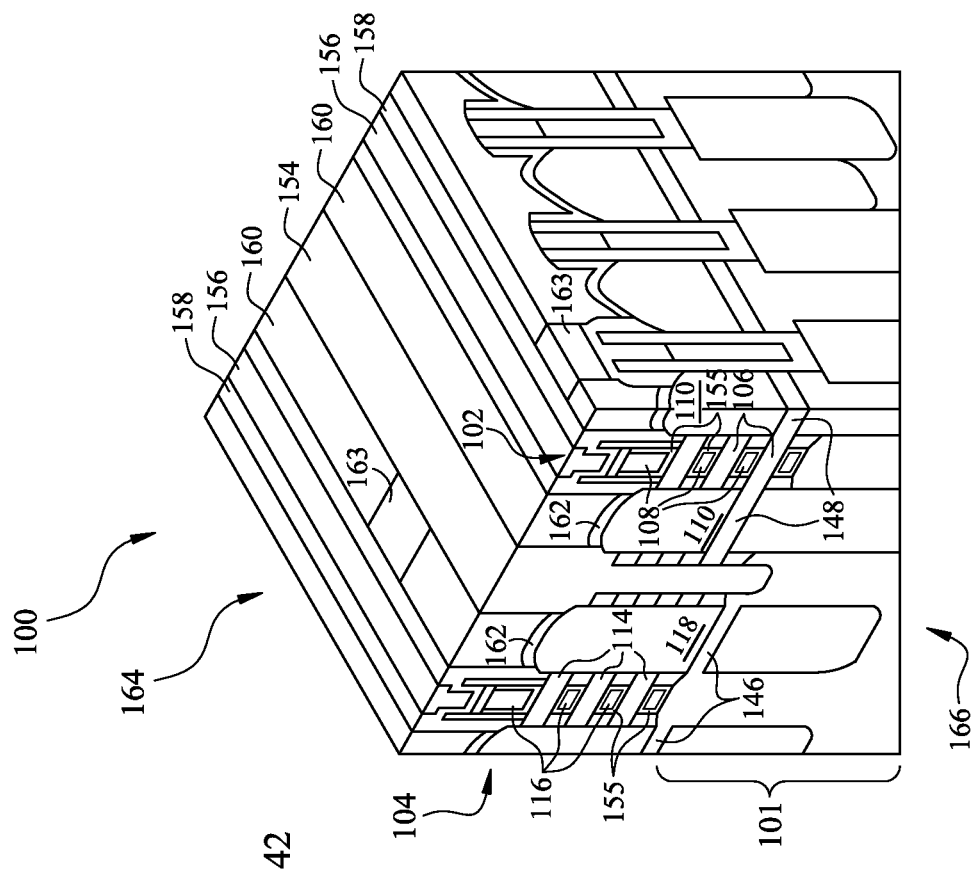
Figure 2H:
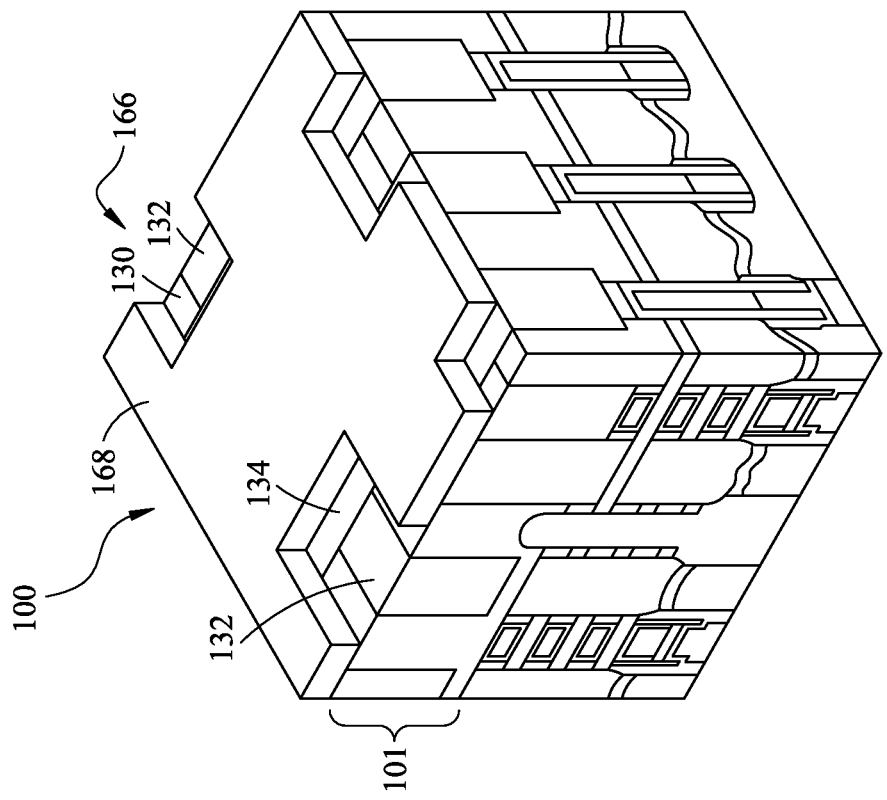
Figure 2G:
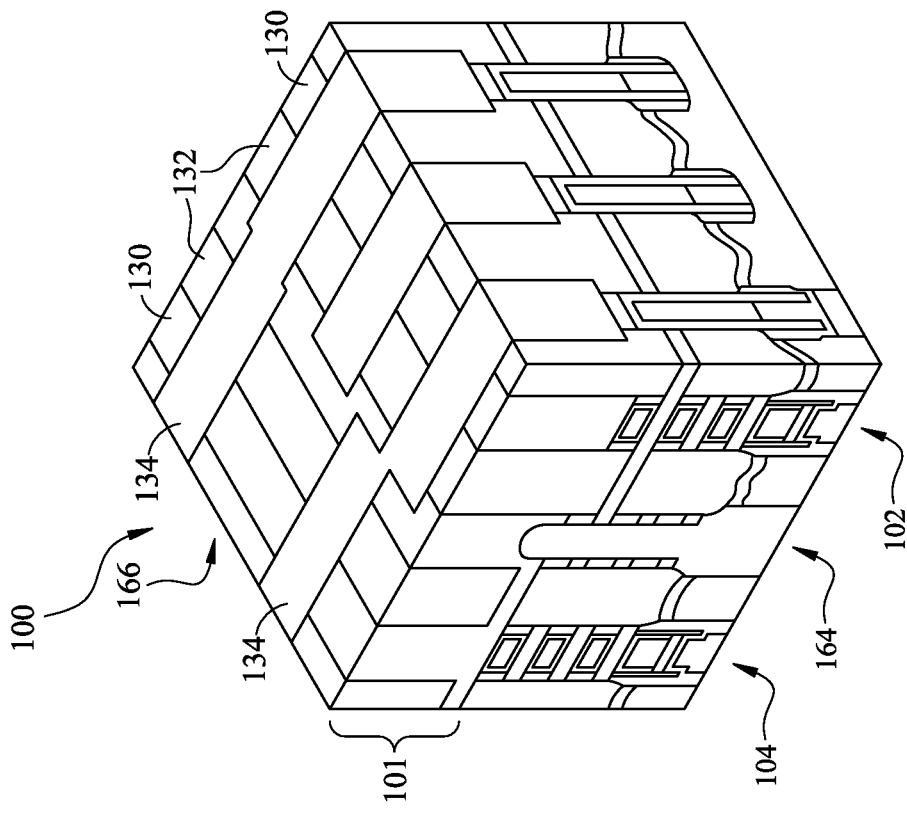
Figure 2J:
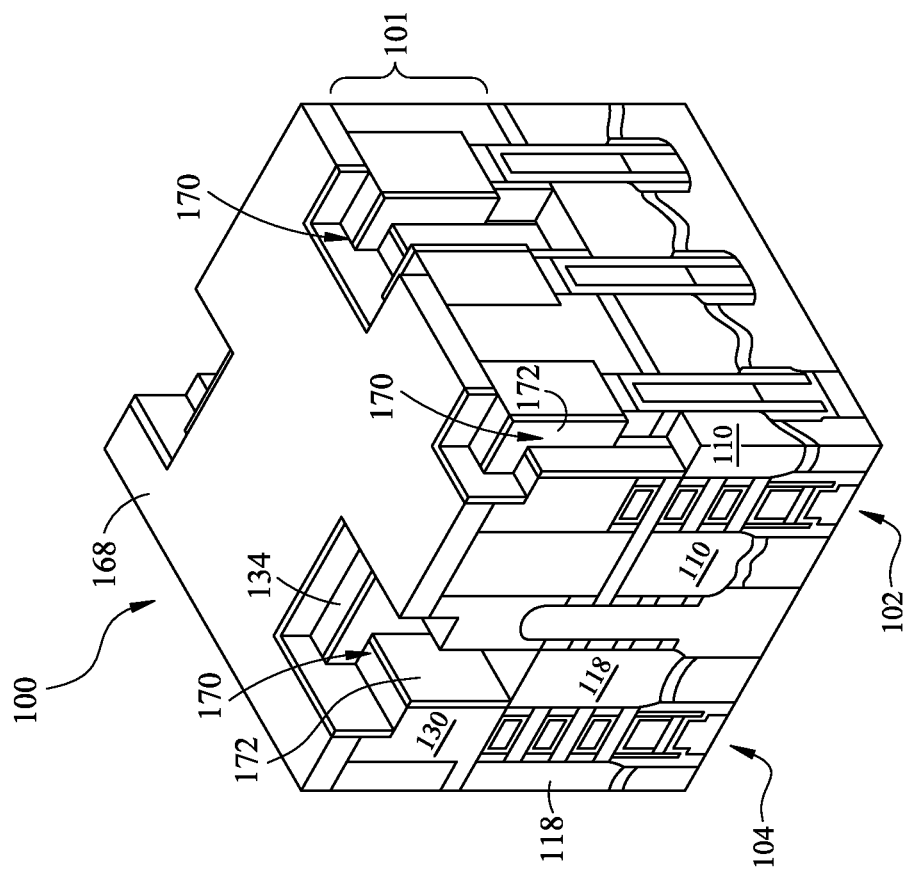
Figure 2I:
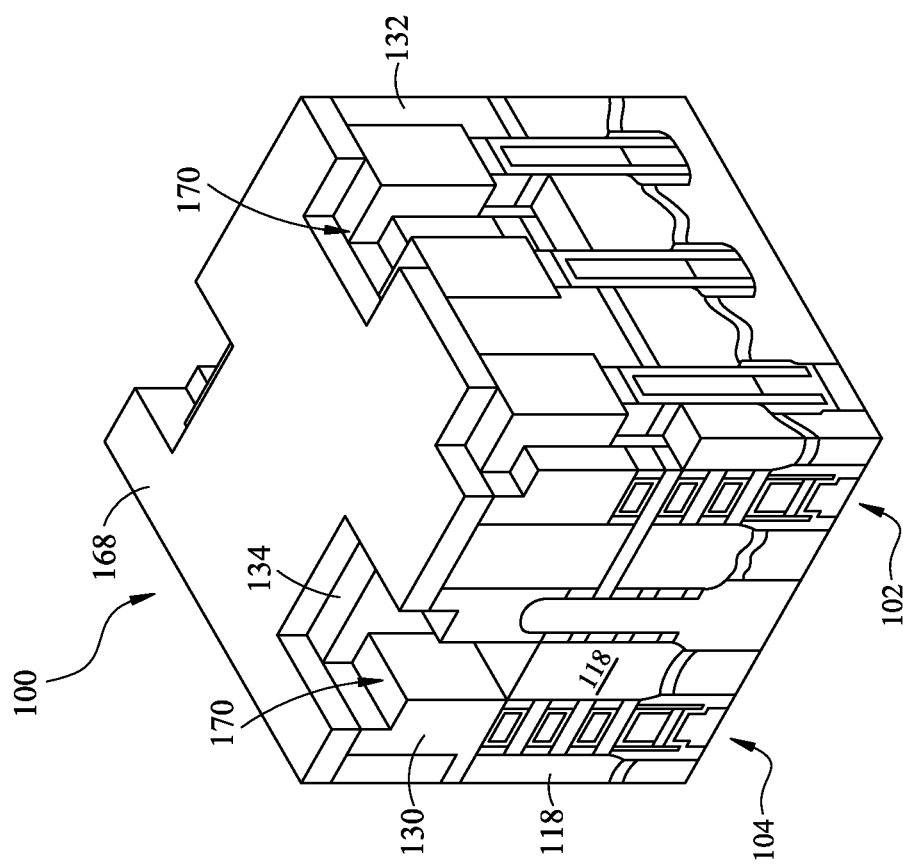
Figure 2L:
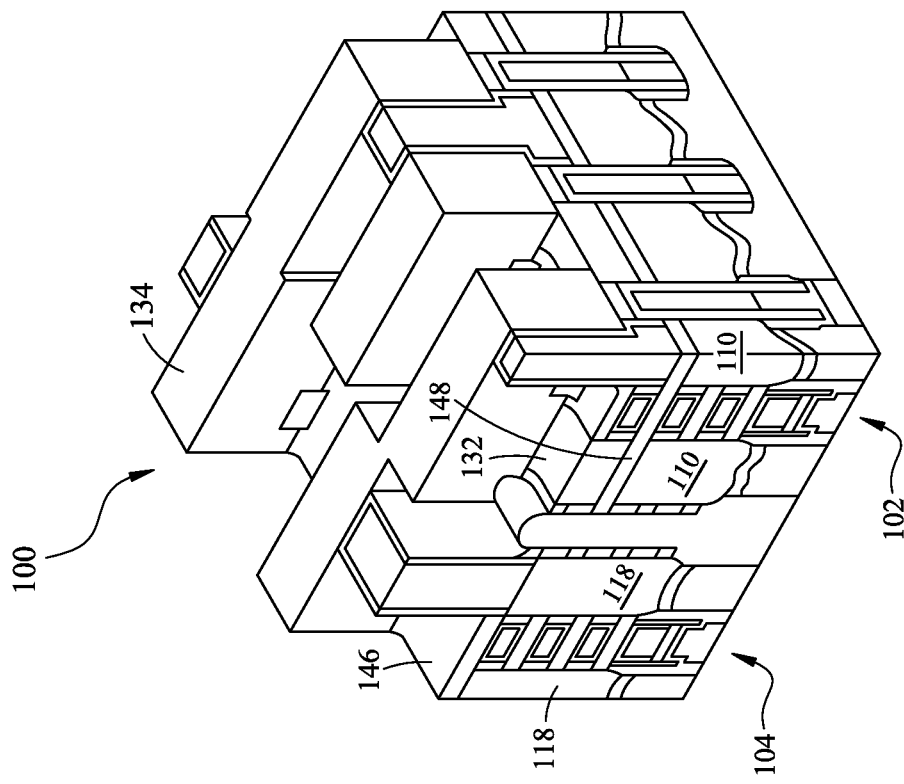
Figure 2K:
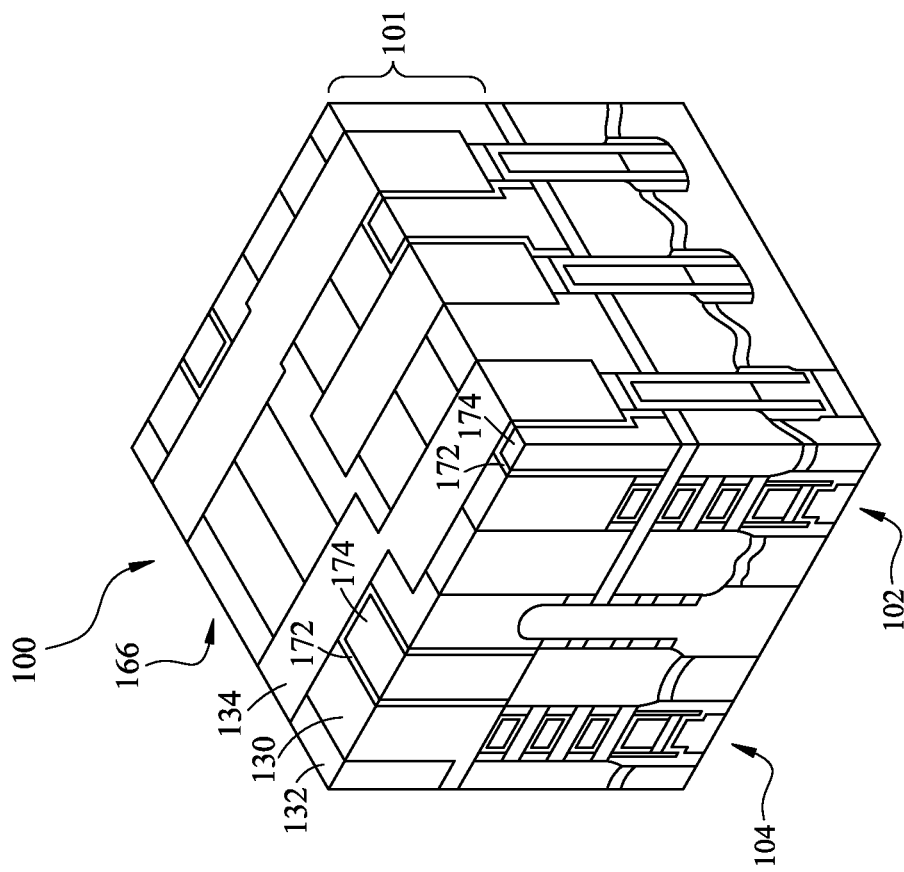
Figure 2M:
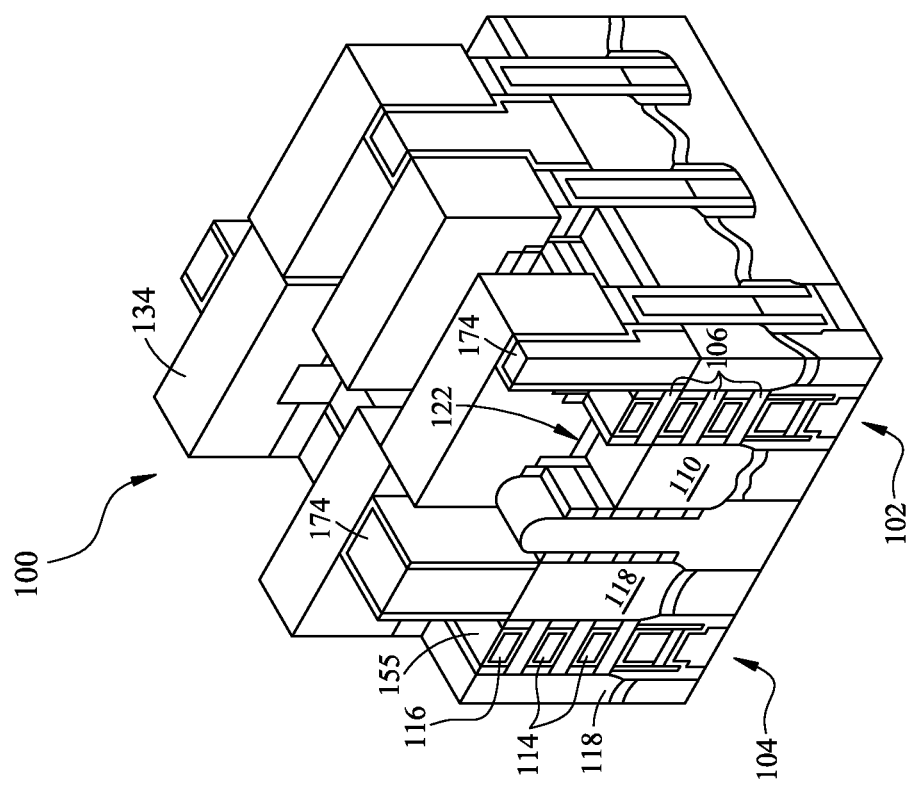
Figure 2O:
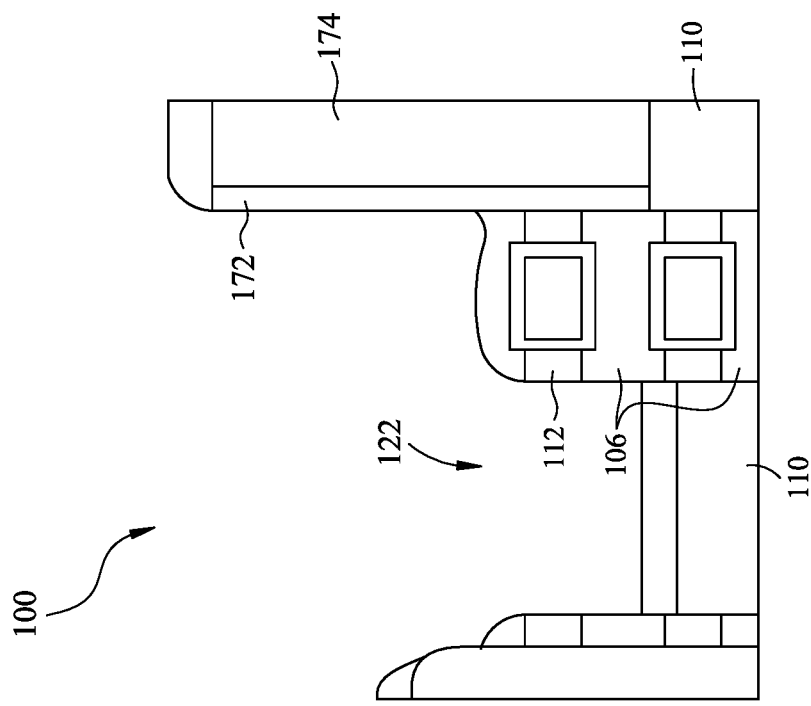
Figure 2N:
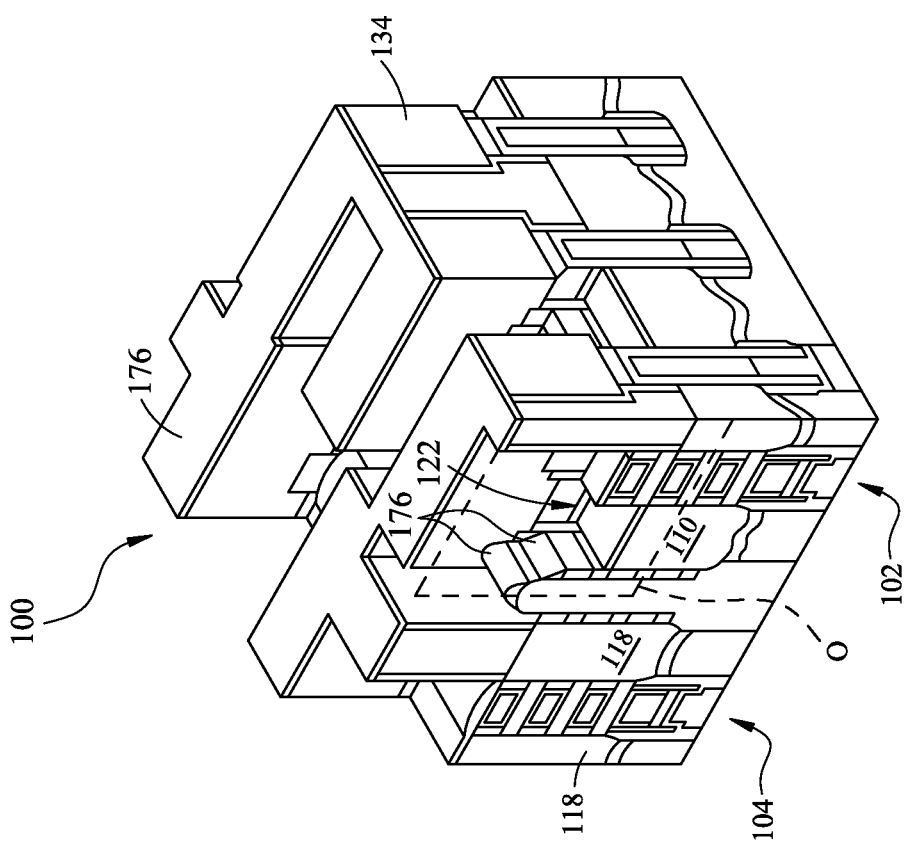
Figure 2Q:
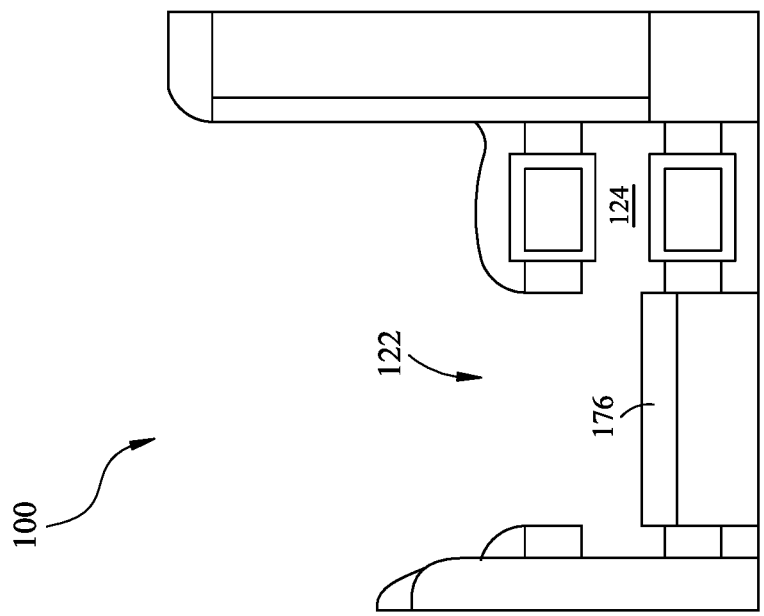
Figure 2P:
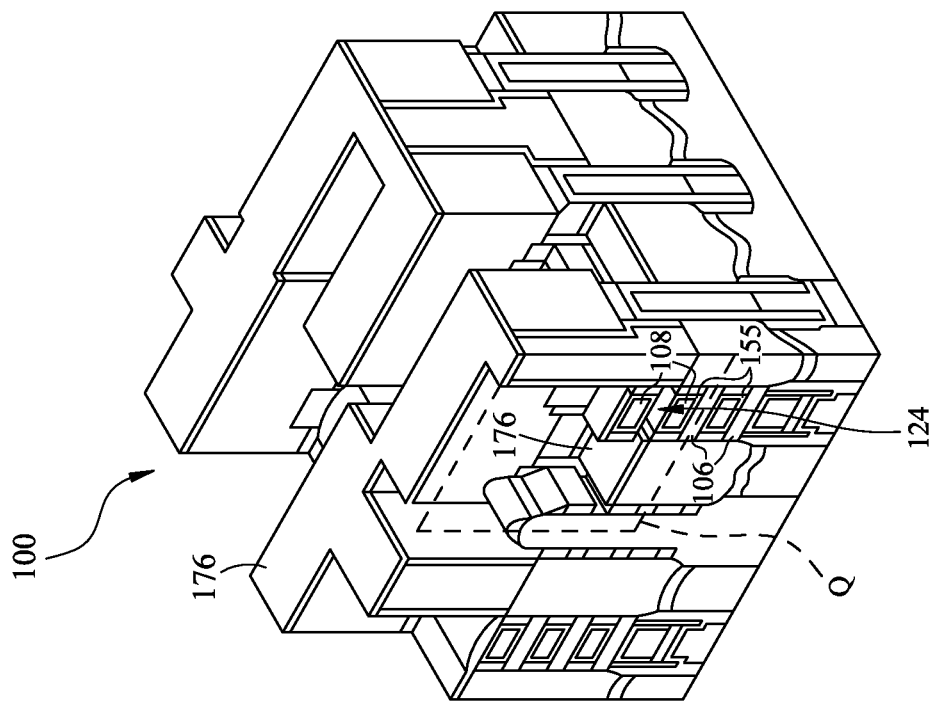
Figure 2S:
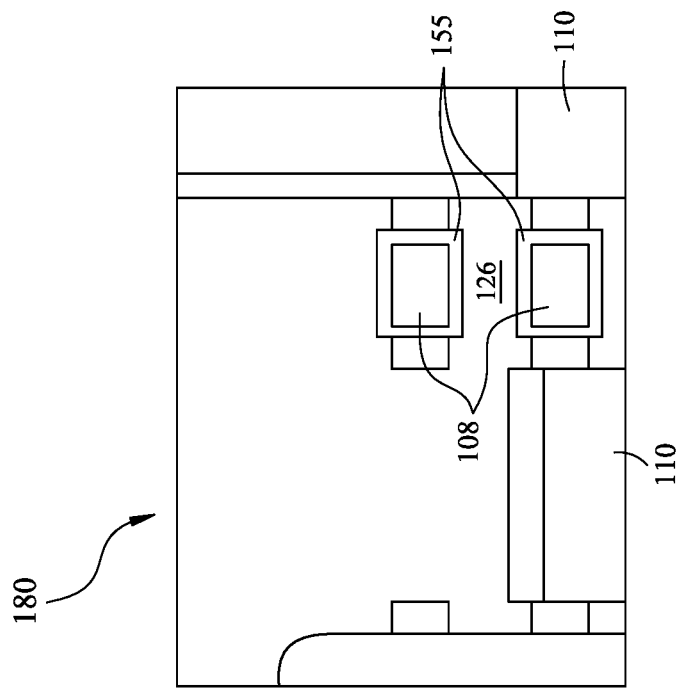
Figure 2R:
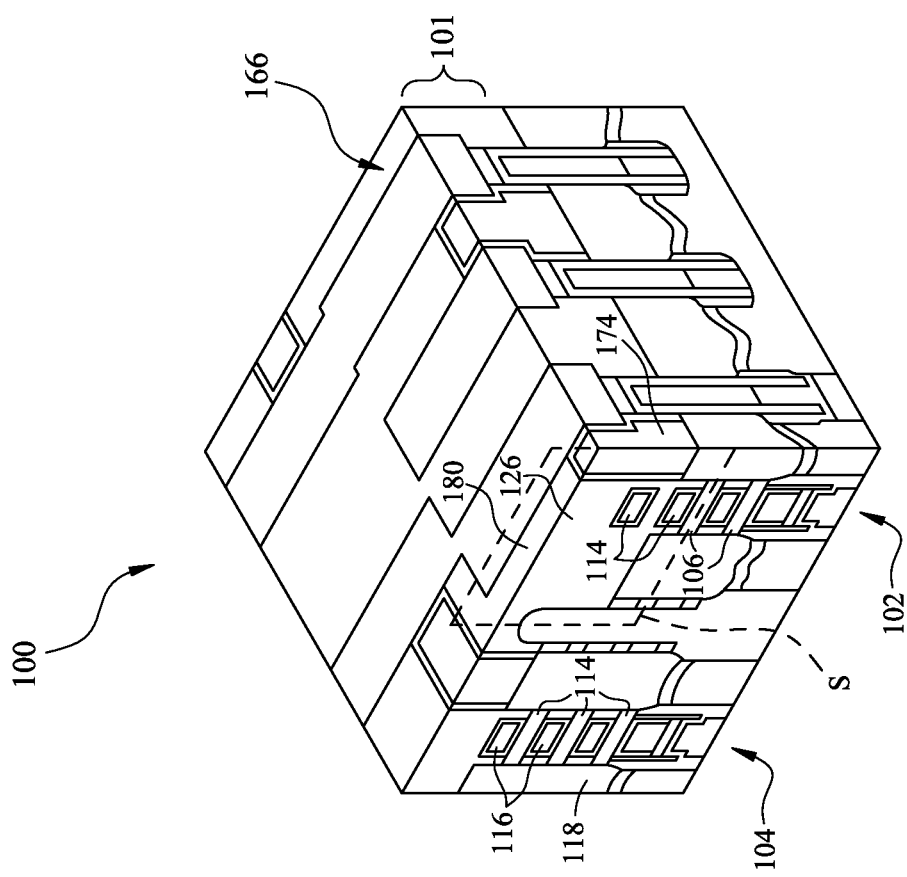
Figure 2T:
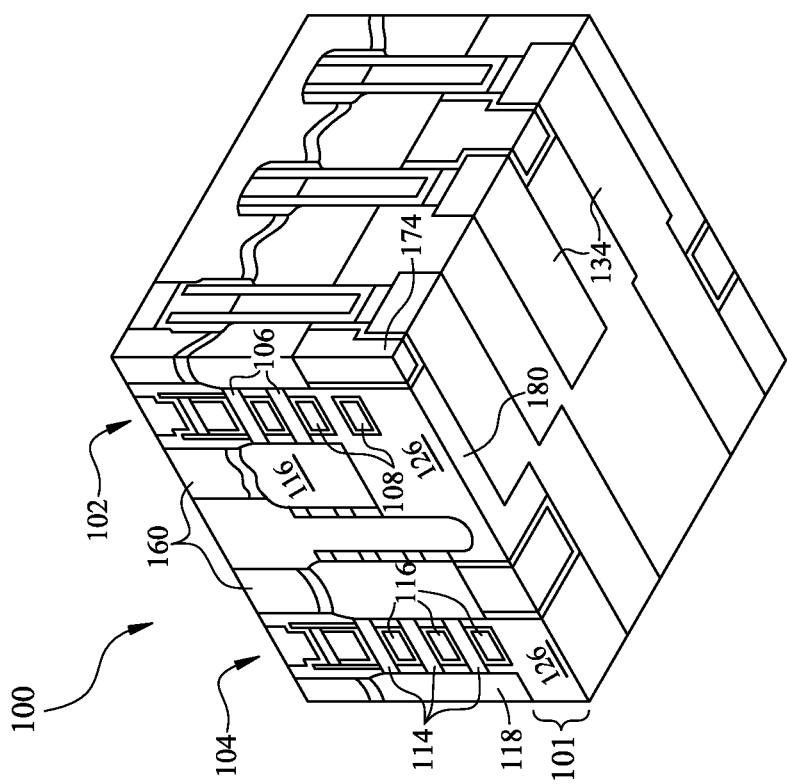

FIGS. 2A-2T include perspective views and cross-sectional views of an integrated circuit 100 at various stages of processing, according to some embodiments. FIGS. 2A-2T illustrate an exemplary process for producing an integrated circuit that includes nanosheet transistors. FIGS. 2A-2T illustrate how these transistors can be formed in a simple and effective process in accordance with principles of the present disclosure. Other process steps and combinations of process steps can be utilized without departing from the scope of the present disclosure. While the Figures and description may focus primarily on nanosheet transistors including stacked semiconductor nanosheets as channel regions, principles of the present disclosure can extend more generally to semiconductor nanostructure transistors including semiconductor nanostructures acting as stacked channels of the transistors. The nanostructures can include nanosheets, nanowires, or other types of nanostructures. The nanostructure transistors can include gate all around transistors, multi-bridge transistors, nanosheet transistors, nanowire transistors, or other types of nanosheet transistors.

The nanosheet transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanosheet structure.

In FIG. 2A the integrated circuit 100 includes a substrate 101. In one embodiment, the substrate 101 includes a first semiconductor material 130. The semiconductor material 130 may include a single crystalline semiconductor layer on at least a surface portion. The substrate 101 may include a single crystalline semiconductor material such as, but not limited to Si, Ge, SiGe, GaAs, InSb, GaP, GaSb, InAlAs, InGaAs, GaSbP, GaAsSb and InP. In the example process described herein, the first semiconductor material 130 includes Si, though other semiconductor materials can be utilized without departing from the scope of the present disclosure.

The substrate 101 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 101 may include various regions that have been suitably doped with impurities (e.g., p-type or n-type conductivity). The dopants are, for example boron ($BF_2$) for an n-type transistor and phosphorus for a p-type transistor.

The substrate 101 includes a second semiconductor material 132. The second semiconductor material 132 is selectively etchable with respect to the first semiconductor material 130. In the example process described herein, the semiconductor material 132 is silicon germanium. However, other materials can be utilized for the second semiconductor material 132 without departing from the scope of the present disclosure.

The substrate 101 includes shallow trench isolation regions 134. The dielectric material for the shallow trench isolation regions 134 may include silicon oxide, silicon nitride, silicon oxynitride (SiON), SiOCN, SiCN, fluorine-doped silicate glass (FSG), or a low-K dielectric material. Other materials and structures can be utilized for the shallow trench isolation regions 134 without departing from the scope of the present disclosure.

The integrated circuit 100 includes three fins 128. The base of the rightmost fin 128 includes three semiconductor nanosheets 106 and three sacrificial semiconductor nanosheets 136. As will be set forth in more detail below, the rightmost fin will be utilized to form a first transistor 102 including two semiconductor nanosheets 106.

The base of the leftmost fin 128 includes three semiconductor nanosheets 114 and three sacrificial semiconductor nanosheets 136. As will be set forth in more detail below, the leftmost fin will be utilized to form a second transistor 104 including three semiconductor nanosheets 136. As will be set forth in more detail below, the central fin 128 will eventually be utilized as isolation between the first and second transistors 102 and 104.

The semiconductor nanosheets 106 and 114 include a semiconductor material. In one example, the semiconductor nanosheets 106 and 114 include silicon. The sacrificial semiconductor nanosheets 136 include a semiconductor material different than the semiconductor material of the semiconductor nanosheets 106 and 114. The sacrificial semiconductor nanosheets material that is selectively etchable with respect to the material of the semiconductor nanosheets 106 and 114. In one example, the sacrificial semiconductor nanosheets 136 include silicon germanium. The vertical thickness of the semiconductor nanosheets 106 and 114 can be between 2 nm and 15 nm. The thickness of the sacrificial semiconductor nanosheets 136 can be between 5 nm and 15 nm. These thicknesses may allow sufficiently large currents to flow through the semiconductor nanosheets 106 and 114, while allowing gate electrodes to be formed in place of the sacrificial semiconductor nanosheets 136, as will be described more detail below. Other thicknesses and materials can be utilized for the semiconductor nanosheets 106 and 114 and the sacrificial semiconductor layers 136 without departing from the scope of the present disclosure. As will be set forth in more detail below, the sacrificial semiconductor layers 136 sacrificial in the sense that they will eventually be etched away and replaced with gate metals of gate electrodes 108 and 116 of the first and second transistors 102 and 104 respectively.

The rightmost fin 128 includes inner spacers 112 positioned in recesses formed from the sacrificial semiconductor layers 136 between the semiconductor nanosheets 106. The leftmost fin 128 includes inner spacers 120 positioned in recesses formed from the sacrificial semiconductor layers 136 between the semiconductor nanosheets 114. As will be set forth in more detail below, the inner spacers 112 and 120 help prevent short circuits between source/drain regions and gate electrodes of the first and second transistors. The inner spacers 112 and 120 can include silicon nitride, SiCN, SiOCN, or other suitable dielectric materials.

The fins 128 each include spacer layers 142 formed above the semiconductor nanosheets 114 and 106 and, as will be described in more detail below, will eventually be utilized to form gate electrodes 108 and 116 of the transistors 102 and 104. In one example, the spacer layers 142 include SiCON, though other materials can be utilized for the spacer layers 142 without departing from the scope of the present disclosure.

Each fin 128 includes a dummy gate structure 144 positioned between the gate spacer layers 142 of the semiconductor nanosheets 106 and 114. Each dummy gate structure may include a plurality of dielectric layers stacked on top of each other. The dummy gate structures 144 may include one or more thin dielectric layers 145 and one or more layers of polysilicon 147. The thin dielectric layers 145 may include silicon oxide, silicon nitride, or other dielectric materials.

The dummy gate structures 144 may also include a dielectric layer 149 on the layer of polysilicon 147. The dielectric layer 149 may include silicon nitride, SiOCN, SiCN, or other suitable dielectric materials. The dummy gate structures 144 may also include a dielectric layer 151 on the dielectric layer 151. The dielectric layer 151 may include silicon oxide, silicon nitride, or other suitable dielectric materials. The dummy gate structures 144 may include other numbers of layers, other types of layers, and other types of materials without departing from the scope of the present disclosure.

The integrated circuit 100 also includes hybrid fin structures 140. The hybrid fin structures 140 extends in a direction transverse to the fins 128. The hybrid fin structures 140 can be utilized to separate source/drain regions of adjacent transistors. Each fin 128 may eventually include multiple transistors. The hybrid fin structures 140 electrically isolate the transistors of a fin 128 from each other.

The hybrid fin structures 140 include a dielectric layer 153, a dielectric layer 155, and a high-K dielectric layer 157. In some embodiments, the dielectric layer 153 includes silicon nitride. In some embodiments, the dielectric layer 155 includes silicon oxide. The hybrid fin structure 140 include a high-K dielectric layer 157. The high-K dielectric layer 157 can include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K dielectric layer 157 may be termed a helmet layer for the hybrid fin structures 140. Other materials and structures can be utilized for the dielectric layers 153, 155, and 157 without departing from the scope of the present disclosure.

In FIG. 2B, a cap layer 146 has been formed on the substrate 101 on either side of the leftmost fin 128 corresponding to the second transistor 104. More particularly, the cap layer 146 has been formed on the top surface of the second semiconductor material 132 on either side of the leftmost fin 128. The cap layer 146 includes a semiconductor material that is selectively etchable with respect to the second semiconductor material 132. The semiconductor material of the cap layer 146 can be the same semiconductor material as the first semiconductor material 130. Accordingly, in an example in which the second semiconductor material 132 is silicon germanium, the cap layer 146 can include silicon.

The cap layer 146 can be formed in conjunction with a photolithography process. In particular, a mask can be formed on the integrated circuit 100. The mask can be patterned using photolithography processes to expose the second semiconductor material 132 on either side of the leftmost fin 128 and to cover the semiconductor material 132 on either side of the rightmost fin 128. In the presence of the mask, the exposed portions of the second semiconductor material 132 can be recessed using a timed etching process. An epitaxial growth can then be performed to grow the cap layer 146 on top of the recessed second semiconductor material 132 on either side of the leftmost fin 128. Other materials and processes can be utilized to form the cap layer 146 without departing from the scope of the present disclosure.

In FIG. 2C, a cap layer 148 has been formed on the substrate 101 on either side of the rightmost fin 128 corresponding to the first transistor 102. More particularly, the cap layer 148 has been formed on the top surface of the second semiconductor material 132 on either side of the rightmost fin 128. The cap layer 148 includes a semiconductor material that is selectively etchable with respect to the second semiconductor material 132. The semiconductor material of the cap layer 148 can be the same semiconductor material as the first semiconductor material 130. Accordingly, in an example in which the second semiconductor material 132 is silicon germanium, the cap layer 148 can include silicon.

The cap layer 148 can be formed in conjunction with a photolithography process. In particular, a mask can be formed on the integrated circuit 100. The mask can be patterned using photolithography processes to expose the second semiconductor material 132 on either side of the rightmost fin 128 and to cover the cap layer 146 on either side of the leftmost fin 128. In the presence of the mask, the exposed portions of the second semiconductor material 132 can be recessed using a timed etching process. An epitaxial growth can then be performed to grow the cap layer 148 on top of the recessed second semiconductor material 132 on either side of the rightmost fin 128. Other materials and processes can be utilized to form the cap layer 148 without departing from the scope of the present disclosure.

In FIG. 2D, source/drain regions 110 and 118 have been formed. The source/drain regions 110 and 118 includes semiconductor material. The source/drain regions 110 are grown on either side of the rightmost and 128 corresponding to the first transistor 102. The source/drain regions 110 are grown on either side of the leftmost fin 128 corresponding to the second transistor 104. The source/drain regions 110 can be epitaxially grown from one or both of the semiconductor nanosheets 106 and a cap layer 148. The source/drain regions 118 can be epitaxially grown from one or both of the semiconductor nanosheets 114 and the cap layer 146. The source/drain regions 110 and 118 can be epitaxially grown from the semiconductor nanosheets 106 and 114 or from the substrate 101. The source/drain regions 110 and 118 can be doped with N-type dopants species in the case of N-type transistors. The source/drain regions 110 and 118 can be doped with P-type dopant species in the case of P-type transistors. The doping can be performed in-situ during the epitaxial growth. The hybrid fin structures 140 can act as electrical isolation between the source/drain regions 110 of adjacent transistors formed from the rightmost fin 128. By fin structures 140 can act as electrical isolation between the source/drain regions 118 of adjacent transistors formed from the leftmost fin 128.

As can be seen in FIG. 2D, the source/drain regions 110 only directly contact the top two semiconductor nanosheets 106. The bottom semiconductor nanosheet 106 is not directly contacting by the source/drain regions 110. The source/drain regions 118 contact all three semiconductor nanosheets 114. The difference between the source/drain regions 110 and 118 is based on the different heights of the cap layers 146 and 148. Because the cap layer 146 is positioned at a level substantially even with the lowest semiconductor nanosheet 106, the source/drain region 110 has a bottom surface that is higher or even with a top surface of the lowest semiconductor nanosheet 106. However, because the cap layer 146 has a top surface lower than the bottom semiconductor nanosheet 114, the source/drain regions 118 are grown in direct contact with all three semiconductor nanosheets 114. The bottoms of the source drain regions 118 is lower than the bottoms of the source/drain regions 110.

In FIG. 2E, a dielectric liner 150 has been grown on the sides of the gate spacers 142 and on the top surfaces of the source/drain regions 110 and 118. A dielectric material 152 has been deposited in the gaps between the fins 128. The dielectric liner 150 can include silicon nitride or another suitable material. The dielectric material 152 can include silicon oxide or another suitable material.

After deposition of the dielectric materials 150 and 152, a cutting process has been performed to reduce the height of the fins 128. The cutting process exposes the polysilicon of the dummy gates 144. The cutting process can include one or more of a dry etching process, a wet etching process, and a chemical mechanical planarization (CMP) process. A mask is then formed and patterned to expose the central fin 128. A trench is then etched through the central fin 128. The trench in the central fin 128 is then filled with a dielectric material 154. The dielectric material 154 also covers the dielectric material 152. The dielectric material 154 extends downward between the fins 128 acts as an isolation between the first and second transistors that will be formed in the left and right fins 128. Various other processes can be utilized to arrive at the structure shown in FIG. 2E without departing from the scope of the present disclosure.

In FIG. 2F, the remainder of the dummy gate structures 144 have been removed. The sacrificial semiconductor nanosheets 136 have been removed. The sacrificial semiconductor nanosheets 136 can be removed with an etching process that selectively etches the sacrificial semiconductor nanosheets 136 with respect to the material of the semiconductor nanosheets 106 and 114. After the etching process, the semiconductor nanosheets 106 and 114 are no longer covered by sacrificial semiconductor structures.

In FIG. 2F a gate dielectric 155 has been deposited on the exposed surfaces of the semiconductor nanosheets 106 and 114. The gate dielectric 155 is shown as only a single layer. However, in practice, the gate dielectric 155 may include multiple dielectric layers. For example, the gate dielectric 155 may include an interfacial dielectric layer that is in direct contact with the semiconductor nanosheets 106 and 114. The gate dielectric 155 may include a high-K gate dielectric layer positioned on the interfacial dielectric layer. Together, the interfacial dielectric layer and the high-K gate dielectric layer form a gate dielectric 155 for the first and second transistors 102 and 104.

The interfacial dielectric layer can include a dielectric material such as silicon oxide, silicon nitride, or other suitable dielectric materials. The interfacial dielectric layer can include a comparatively low-K dielectric with respect to high-K dielectric such as hafnium oxide or other high-K dielectric materials that may be used in gate dielectrics of transistors.

The interfacial dielectric layer can be formed by a thermal oxidation process, a chemical vapor deposition (CVD) process, or an atomic layer deposition (ALD) process. The interfacial dielectric layer can have a thickness between 0.5 nm and 2 nm. One consideration in selecting a thickness for the interfacial dielectric layer is to leave sufficient space between the semiconductor nanosheets 106 and 114 for gate metals, as will be explained in more detail below. Other materials, deposition processes, and thicknesses can be utilized for the interfacial dielectric layer without departing from the scope of the present disclosure.

The high-K gate dielectric layer and the interfacial dielectric layer physically separate the semiconductor nanosheets 106 and 114 from the gate metals that will be deposited in subsequent steps. The high-K gate dielectric layer and the interfacial dielectric layer isolate the gate metals from the semiconductor nanosheets 106 and 114 that correspond to the channel regions of the transistors.

The high-K gate dielectric layer includes one or more layers of a dielectric material, such as $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer may be formed by CVD, ALD, or any suitable method. In one embodiment, the high-K gate dielectric layer is formed using a highly conformal deposition process such as ALD in order to ensure the formation of a gate dielectric layer having a uniform thickness around each semiconductor nanosheet 106 and 114. In one embodiment, the thickness of the high-k dielectric is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes HfO2 with dipole doping including La and Mg, and a second layer including a higher-K ZrO layer with crystallization.

After deposition of the gate dielectric 155, a gate metal is deposited. The gate metal forms a gate electrode 108 around the semiconductor nanosheets 106 of the transistor 102. The gate metal forms a gate electrode 116 around the semiconductor nanosheets 114 of the second transistor 104. The gate metal is in contact with the gate dielectric 155. The gate metal is positioned between semiconductor nanosheets 106 and 114. In other words, the gate metal is positioned all around the semiconductor nanosheets 106 and 114. For this reason, the transistors 102 and 104 formed in relation to the semiconductor nanosheets 106 and 114 are called gate all around transistors.

Although the gate electrodes 108 and 116 are each shown as a single metal layer, in practice, the gate electrodes 108 and 116 may each include multiple metal layers. For example, the 108 and 116 may include one or more very thin work function layers in contact with the gate dielectric 155. The thin work function layers can include titanium nitride, tantalum nitride, or other conductive materials suitable for providing a selected work function for the transistors. The gate electrodes 108 and 116 can further include a gate fill material that corresponds to the majority of the gate electrodes 108 and 116. The gate fill material can include cobalt, tungsten, aluminum, or other suitable conductive materials. The layers of the gate electrodes 108 and 116 can be deposited by PVD, ALD, CVD, or other suitable deposition processes.

A dielectric cap layer 156 and a dielectric liner layer 158 have been formed on the exposed portions of the gate electrodes 108 and 116 at the top of the integrated circuit 100. The cap layer 156 may include silicon oxide or other suitable dielectric materials. The liner layer 128 may include silicon nitride or another suitable dielectric material.

A silicide layer 162 has been formed on the top surfaces of the source/drain regions 110 and 118. The silicide layer 162 can include titanium silicide, aluminum silicide, nickel silicide, tungsten silicide, or other suitable silicides. Source/drain contacts 160 have been formed on the silicide 162. The source/drain contacts 160 can include a conductive material such as tungsten, titanium, aluminum, tantalum, or other suitable conductive materials. Dielectric breaks 163 may be inserted into the source/drain contacts 162 selectively in order to isolate some transistors from others. The dielectric breaks can include silicon oxide, silicon nitride, or other dielectric materials.

At the stage shown in FIG. 2F, from then processing is complete. The transistors 102 and 104 have been formed. The transistor 102 includes two semiconductor nanosheets 106 extending between the source/drain regions 110. The bottom semiconductor nanosheet 106 is not connected to the source/drain regions 110. A gate dielectric 155 is positioned on the surfaces of the semiconductor nanosheets 106. A gate electrode 108 surrounds the semiconductor nanosheets 106, with the gate dielectric 155 positioned between the semiconductor nanosheets 106 and the gate electrode 108.

The transistor 104 includes three semiconductor nanosheets 114 extending between the source/drain regions 118. The gate dielectric 155 is positioned on the surfaces of the semiconductor nanosheets 114. A gate electrode 116 surrounds the semiconductor nanosheets 114, with the gate dielectric 155 positioned between the semiconductor nanosheets 114 and the gate electrode 116.

Though not shown in FIG. 2F, middle end of line processing may also be complete at this stage of processing. This can include the formation of interlevel dielectric layers and metal interconnect structures formed in the interlevel dielectric layers. The metal interconnect structures can include metal lines and conductive vias. In FIG. 2F, the top side 166 of the integrated circuit 100 is facing upward. The backside 164 of the substrate 101 is facing downward.

In FIG. 2G, the integrated circuit 100 has been flipped. The top side 164 is now facing downward. The backside 166 of the substrate 101 is now facing upward. Though not shown in FIG. 2G, the flipping can be accomplished by attaching a carrier wafer to the top side 164 of the integrated circuit 100 and flipping the integrated circuit 100 so that the backside 166 of the substrate 101 is exposed and facing upward.

In FIG. 2G, the substrate 101 has been thinned. A grinding process is performed to reduce the thickness of the substrate 101. The thickness of the substrate 101 is reduced so that the first semiconductor material 130, the second semiconductor material 132, and the shallow trench isolation regions 134 are exposed at the backside 166 of the substrate 101.

In FIG. 2H, a mask 168 is formed on the backside 166 of the substrate 101. The mask 168 can include one or both of the photoresist mask and the hard mask. The mask 168 is patterned using photolithography to expose selected portions from the backside 166 of the substrate 101. In particular, portions of the first semiconductor material 130, the second semiconductor material 132, and the shallow trench isolation regions 134 are exposed by the mask 168.

In FIG. 2I, an etching process is performed. The etching process selectively etches the second semiconductor material 132 with respect to the first semiconductor material 130 and the shallow trench isolation regions 134. The result is that trenches 170 are opened exposing the bottom surfaces of some of the source/drain regions 110 and 118 of the transistors 102 and 104, respectively. Because the second semiconductor material 132 is respectively etchable with respect to the first semiconductor material 130, the etching process does not substantially etch the first semiconductor material 130. The pattern of the mask 168 is selected so that only one of the source/drain regions 110 and one and the source/drain regions 118 are exposed.

In FIG. 2J, a dielectric layer 172 has been formed on the sidewalls of the trenches 170. The dielectric layer 172 may initially be deposited in a calm formal manner on the sidewalls of the trenches 172 and on top of the exposed surfaces of the source/drain regions 110 and 118, and on the exposed surfaces of the first semiconductor material 130 and the shallow trench isolation regions 134. After deposition, an anisotropic etching process is performed to remove the dielectric layer 172 from the exposed surfaces of the source/drain regions 110 and 118. Because the anisotropic etching process etches selectively in the vertical direction, the dielectric layer 172 is entirely removed from upward facing surfaces but not from the sidewalls of the trenches 170.

In FIG. 2K, backside source/drain contacts 174 have been formed in the trenches 170. The backside source/drain contacts 174 contacts the surfaces of the source/drain regions 110 and 118 exposed by the trenches 170. The source/drain contacts 174 can include a conductive material such as tungsten, titanium, aluminum, or other suitable materials. Though not shown in FIG. 2K, a silicide may first be formed on the exposed surfaces of the source/drain regions 110 and 118.

In FIG. 2L, an anisotropic etching process has been performed. The anisotropic etching process selectively etches the first semiconductor material 130 and the second semiconductor material 132 with respect to the shallow trench isolation regions 134. The anisotropic etching process etches in the vertical direction. The anisotropic etching process is a timed etching process with a timing selected to etch to a level of the cap layer 146. Other etching processes can be utilized to arrive at the structure of FIG. 2L without departing from the scope of the present disclosure.

In FIG. 2M, an etching process has been performed to fully open trenches 122 in the backside 166 of the substrate 101. A first step of the etching process removes remaining portions of the second semiconductor material 132. A second step of the etching process removes the cap layers 146 and 148. The result is that the source/drain regions 110 and 118 that are not contacted by a backside via 174 are exposed. Furthermore, the first transistor 102, the side of bottom semiconductor nanosheet 106 is exposed. The bottom semiconductor nanosheet 114 of the transistor 104 is not exposed.

In FIG. 2N, a dielectric layer 176 is deposited on the top surfaces of exposed structures. The dielectric layer 176 is not located on the sidewalls of the exposed structures. Accordingly, the side wall of the lowest semiconductor nanosheet 106 of the transistor 102 is not covered by the dielectric layer 172. This can be accomplished by initially performing a conformal deposition of a dielectric material. After initial deposition, a plasma treatment process is performed on the exposed top surfaces of the dielectric layer 176. The plasma treatment alters the composition or structure of the dielectric layer 176 compared to the untreated portions of the dielectric layer that are initially on the sidewalls. An etching process has been performed that selectively etches the untreated sidewall surfaces with respect to the treated top surfaces of the dielectric layer 176. The result is that the dielectric material is removed from the sidewalls of the various exposed structures. The dielectric layer 176 can include silicon nitride or another suitable dielectric material.

FIG. 2O is an enlarged cross-sectional view of a portion of the integrated circuit 100 corresponding to the cut box O of FIG. 2N. The enlarged cross-sectional view illustrates how the dielectric layer 176 is positioned on and protects the source/drain region 110 while leaving the side wall of the lowest semiconductor nanosheet 104 exposed. FIG. 2O also helps to illustrate how the lowest semiconductor nanosheet 106 can possibly become short circuiting with the backside source/drain contact 174 or the source/drain region 110, thereby reducing the desired effect of having only two semiconductor nanosheets 106 directly coupled to the source/drain regions 110.

In FIG. 2P, an etching process has been performed to remove the bottom semiconductor nanosheet 106 of the transistor 102. The etching process selectively etches the semiconductor material of the semiconductor nanosheets 106 with respect to the dielectric layer 176 and other exposed materials. The etching process can include one or more of a wet etch, a dry etch, or other etching processes. The result of the etching process is that a void 124 is formed in place of the lowest semiconductor nanosheet 106. Though not apparent in FIG. 2P, the gate electrode surrounds the void 124.

FIG. 2Q is an enlarged cross-sectional view of a portion of the integrated circuit 100 corresponding to the cut box Q of FIG. 2P. The enlarged cross-sectional view illustrates that the lowest semiconductor nanosheet 106 has been removed. A void 124 is formed in place of the semiconductor nanosheet 106.

In FIG. 2R, a dielectric material 126 has been deposited in the trench 122. The dielectric material 126 fills the void 124 where the lowest semiconductor nanosheet 106 was previously located. The dielectric material 126 can be deposited by an ALD process, a CVD process, a PVD process, or any other suitable process. The dielectric material can include SiOCN, or another low K dielectric material. Other dielectric materials can be utilized without departing from the scope of the present disclosure.

Deposition of the dielectric material 126 results in formation of a dielectric fin 180 in the substrate 101.

At the stage of processing shown in FIG. 2R, the substrate 101 is now primarily made up of the dielectric material 126 and the shallow trench isolation regions 134. The semiconductor materials 130 and 132 have been entirely removed, or mostly removed, depending on the particular process and design choices. Various other processes can be implemented to carry out principles of the present disclosure without departing from the scope of the present disclosure.

With the dielectric material 126 replacing the lowest semiconductor nanosheet 106, the transistor 102 includes two semiconductor nanosheets 106 while the transistor 104 includes three semiconductor nanosheets 114. The result is that the transistors 102 and 104 have different electrical characteristics. For example, the transistor 104 has a higher transconductance and may conduct a higher total current when turned on than does the transistor 102. The transistor 102 does not suffer from the drawbacks of having a floating semiconductor nanosheet 106, such as leakage, parasitic capacitance, and possible short circuits.

FIG. 2S is an enlarged cross-sectional view a portion of the integrated circuit 100 corresponding to the cut box S of FIG. 2R. The view of FIG. 2 is illustrates how the dielectric material 126 fills the void 124 where the lowest semiconductor nanosheet was previously located.

FIG. 2T is a perspective view of the integrated circuit 100, according to some embodiments. In FIG. 2T, the integrated circuit 100 has been flipped so that the substrate 101 has returned to the lower position. The dielectric fin 180 is positioned in the substrate 101 below the transistor 102. The lowest semiconductor nanosheet 106 has been removed from the transistor 102 and replaced with the dielectric material 126 of the dielectric fin 180. Accordingly, the gate electrode 108 surrounds a portion of the dielectric fin 180. The lowest semiconductor nanosheet 114 of the transistor 104 is lower than the lowest semiconductor nanosheet 106 of the transistor 102. The bottom of the gate electrode 116 of the transistor 104 is substantially level with a bottom of the gate electrode 108 of the transistor 102. The bottom of the source/drain region 118 is lower than the bottom of the source/drain region 110 of the transistor 102. There are more semiconductor nanosheets 114 of the transistor 104 than there are semiconductor nanosheets 106 of the transistor 102. The bottom the shallow trench isolation 134 is substantially coplanar with the bottom of the dielectric fin structure 180.

While FIGS. 2A-2T illustrate removal of a single semiconductor nanosheet 106, other numbers of nanosheets 106 can be removed without departing from the scope of the present disclosure. Using principles of the present disclosure, various numbers of semiconductor nanosheets can be included in the various transistors in an integrated circuit. For example, three transistors may each initially include five semiconductor nanosheets. After processing has been completed, a first transistor may have five semiconductor nanosheets, a second transistor may have four semiconductor nanosheets, and a third transistor may have two semiconductor nanosheets. This can be accomplished by utilizing backside trenches and other principles set forth herein. All such variations fall within the scope of the present disclosure.

Furthermore, large numbers of transistors may be formed having differing numbers of semiconductor nanosheets. For example, the process described in relation to FIGS. 2A-2T may result in a large number of the first transistors 102 each having two semiconductor nanosheets 106 and a large number of second transistors 104 each having three semiconductor nanosheets 114.

Figure 3:
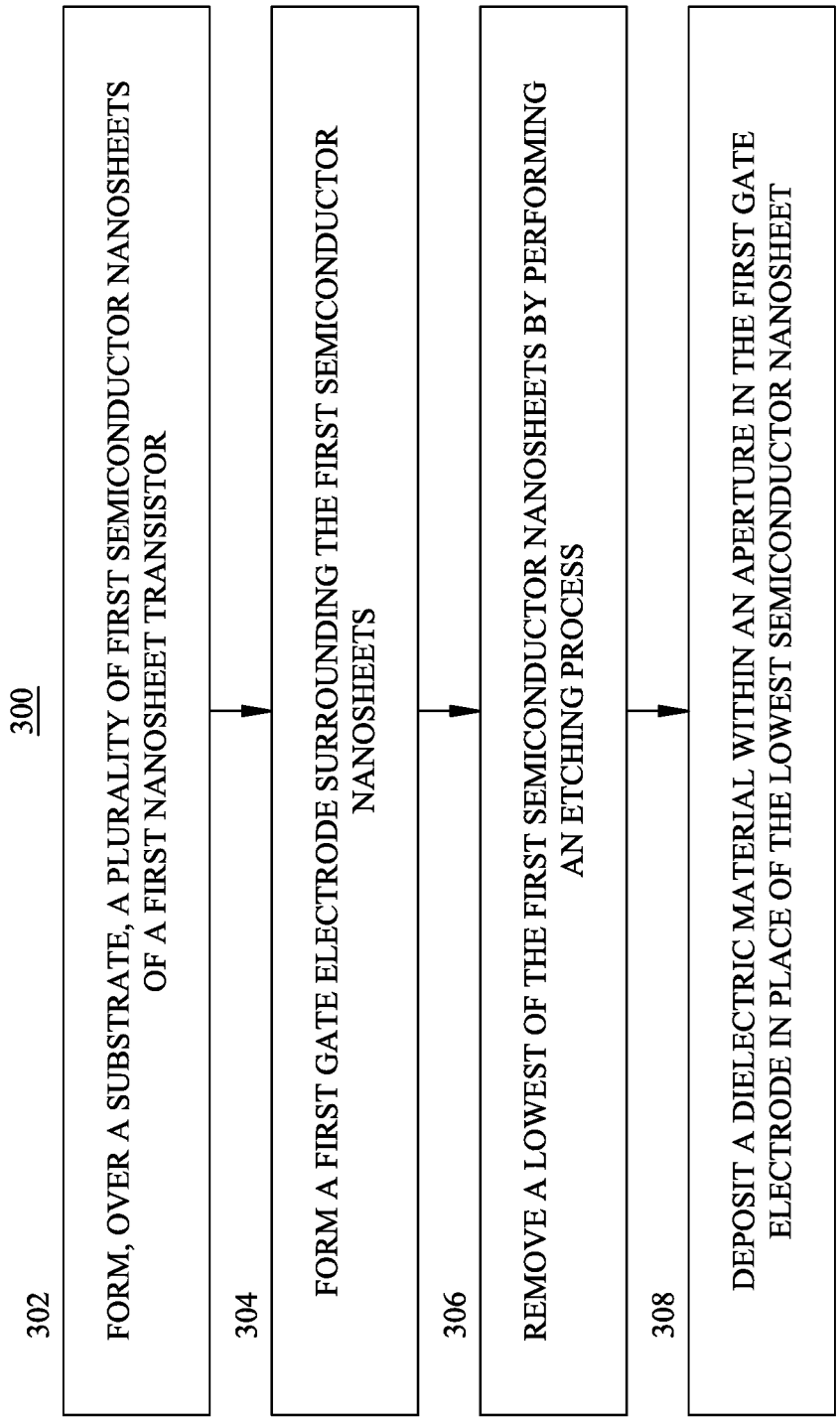
FIG. 3 is a flow diagram of a process for forming an integrated circuit, in accordance with some embodiments.

FIG. 3 is a flow diagram of a method 300 for forming an integrated circuit, in accordance with some embodiments. The method 300 can utilize processes, structures, and components described in relation to FIGS. 1-2S. At 302, the method 300 includes forming, over a substrate, a plurality of first semiconductor nanosheets of a first nanosheet transistor. One example of first semiconductor nanosheets is the first semiconductor nanosheets 106 of FIG. 1A. One example of a first transistor is the first transistor 102 of FIG. 1A. One example of a substrate is the substrate 101 of FIG. 1A. At 304, the method 300 includes forming a first gate electrode surrounding the first semiconductor nanosheets. One example of a first gate electrode is the first gate electrode 108 of FIG. 1A. At 306, the method 300 includes removing a lowest of the first semiconductor nanosheets by performing an etching process. At 308, the method 300 includes depositing a dielectric material within an aperture in the first gate electrode in place of the lowest semiconductor nanosheet. One example of an aperture is the aperture 124 of FIG. 1D. One example of a dielectric material is the dielectric material 126 of FIG. 1E.

Figure 4:
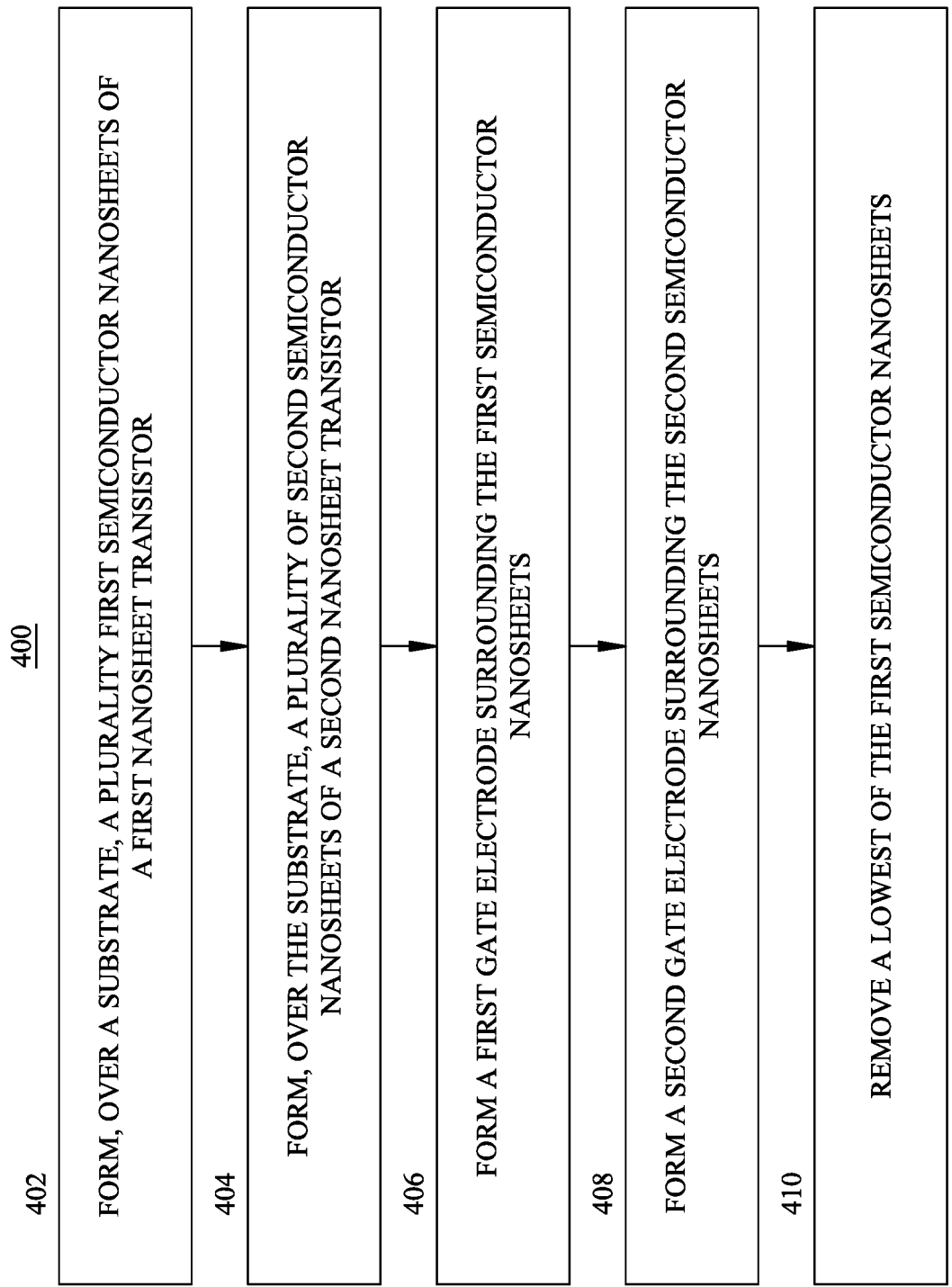
FIG. 4 is a flow diagram of a process for forming an integrated circuit, in accordance with some embodiments.

FIG. 4 is a flow diagram of a method 400 for forming an integrated circuit, in accordance with some embodiments. The method 400 can utilize processes, structures, or components described in relation to FIGS. 1-3. At 402, the method 400 includes forming, over a substrate, a plurality first semiconductor nanosheets of a first nanosheet transistor. One example of a substrate is the substrate 101 of FIG. 1A. One example of a nanosheet transistor is the transistor 102 of FIG. 1A. One example of first semiconductor nanosheets are the first semiconductor nanosheets 106 of FIG. 1A. At 404, the method 400 includes forming, over the substrate, a plurality of second semiconductor nanosheets of a second nanosheet transistor. One example of a second nanosheet transistor is the second nanosheet transistor 104 of FIG. 1A. One example of second semiconductor nanosheets are the second semiconductor nanosheets 114 of FIG. 1A. At 406, the method 400 includes forming a first gate electrode surrounding the first semiconductor nanosheets. One example of a first electrode is the first gate electrode 108 of FIG. 1A. At 408, the method 400 includes forming a second gate electrode surrounding the second semiconductor nanosheets. One example of a second electrode is the second gate electrode 116 of FIG. 1A. At 410, the method 400 includes removing a lowest of the first semiconductor nanosheets.

Embodiments of the present disclosure provide an integrated circuit with a first gate all around nanosheet transistor and a second gate all around nanosheet transistor having differing numbers of nanosheets from each other. During processing, the nanosheet transistors each initially have a same number of nanosheets. The source/drain regions of the first transistor are initially formed so that they contact only the upper nanosheets of the first transistor without contacting the lowest nanosheet of the first transistor. The source/drain regions of the second transistor contact all of the nanosheets of the second transistor. Rather than allow a floating nanosheet below the first transistor, a backside trench is etched through a substrate below the first transistor. The lowest nanosheet of the first transistor is removed through the backside trench and replaced with a dielectric material.

By removing the lowest nanosheet of the first transistor, transistor performance is improved. This is because the lowest unused nanosheet of the first transistor introduces parasitic capacitance and the potential for short circuiting with backside vias that contact the source/drain regions of the first transistor, if the lowest unused nanosheet is not removed. By removing the lowest unused nanosheet of the first transistor, the parasitic capacitance is removed and the possibility of short circuits with backside vias is also removed. The result is first and second transistors that have different numbers of active nanosheets without suffering performance drawbacks. Device performance and wafer yield are improved.

In some embodiments, an integrated circuit includes a substrate and a first nanosheet transistor over the substrate. The first nanosheet transistor includes a first plurality of stacked channels and a first gate electrode. The integrated circuit includes a dielectric fin structure below the first plurality of stacked channels, wherein the first gate electrode surrounds a portion of the dielectric fin structure.

In some embodiments, a method includes forming, over a substrate, a plurality of first semiconductor nanosheets of a first nanosheet transistor and forming a first gate electrode surrounding the first semiconductor nanosheets. The method includes removing a lowest of the first semiconductor nanosheets by performing an etching process and depositing a dielectric material within an aperture in the first gate electrode in place of the lowest semiconductor nanosheet.

In some embodiments, a method includes forming, over a substrate, a plurality first semiconductor nanosheets of a first nanosheet transistor and forming, over the substrate, a plurality of second semiconductor nanosheets of a second nanosheet transistor. The method includes forming a first gate electrode surrounding the first semiconductor nanosheets, forming a second gate electrode surrounding the second semiconductor nanosheets, and removing a lowest of the first semiconductor nanosheets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming, over a substrate, a plurality of first semiconductor nanosheets of a first nanosheet transistor;
    forming a first gate electrode surrounding the first semiconductor nanosheets;
    forming an aperture in the first gate electrode by removing a lowest of the first semiconductor nanosheets by performing an etching process after forming the first gate electrode; and
    depositing a dielectric material within the aperture in the first gate electrode in place of the lowest first semiconductor nanosheet.

2. The method of claim 1, wherein depositing the dielectric material includes forming a dielectric fin structure with the dielectric material below the first semiconductor nanosheets.

3. The method of claim 2, further comprising:
    forming a plurality of second semiconductor nanosheets corresponding to channel regions of a second nanosheet transistor; and
    depositing a second gate electrode surrounding the second semiconductor nanosheets, wherein after the etching process there are more second semiconductor nanosheets than first semiconductor nanosheets.

4. The method of claim 3, wherein after the etching process, a lowest one of the second semiconductor nanosheets is lower than all remaining first semiconductor nanosheets.

5. The method of claim 3, further comprising:
    forming a first source/drain region in contact with the first semiconductor nanosheets; and
    forming a second source/drain region in contact with the second semiconductor nanosheets and having a bottom surface that is lower than a bottom surface of the first source/drain region.

6. The method of claim 1, further comprising, prior to performing the etching process, reducing a thickness of the substrate.

7. The method of claim 1, further comprising removing a semiconductor material of the substrate with the etching process.

8. The method of claim 1, wherein depositing the dielectric material includes depositing the dielectric material in contact with a bottom surface of a source/drain region of the first nanosheet transistor.

9. A method, comprising
    forming, over a substrate, a plurality of first semiconductor nanosheets of a first nanosheet transistor;
    forming, over the substrate, a plurality of second semiconductor nanosheets of a second nanosheet transistor;
    forming a first gate electrode surrounding the first semiconductor nanosheets;
    forming a second gate electrode surrounding the second semiconductor nanosheets; and
    forming an aperture in the first gate electrode by removing a lowest of the first semiconductor nanosheets after forming the first gate electrode.

10. The method of claim 9, further comprising replacing the removed first semiconductor nanosheet with a dielectric material.

11. The method of claim 10, wherein the dielectric structure includes SiOCN.

12. The method of claim 9, wherein the dielectric material is in contact with a first source/drain region of the first nanosheet transistor but not in contact with a second source/drain region of the second nanosheet transistor.

13. A method, comprising:
   forming a first nanosheet transistor over a substrate, including:
      forming a first plurality of stacked channels of the first nanosheet transistor; and
      forming a first gate electrode of the first nanosheet transistor wrapped around the channels; and
   forming an aperture in the first gate electrode below the plurality of stacked channels by performing an etching process after forming the first gate electrode;
   forming a dielectric structure below the first plurality of stacked channels after forming the aperture, wherein a portion of the dielectric structure is in the aperture, wherein the first gate electrode is wrapped around the portion of the dielectric structure.

14. The method of claim 13, further comprising forming a second nanosheet transistor on the substrate, including:
   forming a second plurality of stacked channels of the second nanosheet transistor; and
   forming a second gate electrode of the second nanosheet transistor, wherein the second nanosheet transistor has more stacked channels than the first nanosheet transistor.

15. The method of claim 14, wherein a bottom of the first gate electrode is level with a bottom of the second gate electrode.

16. The method of claim 14, wherein a lowest channel of the second plurality of stacked channels is lower than a lowest channel of the first plurality of stacked channels.

17. The method of claim 14, wherein forming the first nanosheet transistor includes forming a first source/drain region of the first nanosheet transistor over and in contact with the dielectric structure, wherein forming the second nanosheet transistor includes forming a second source/drain region of the second nanosheet transistor having a bottom that is lower than a bottom of the first source/drain region.

18. The method of claim 13, wherein the substrate includes a shallow trench isolation region, wherein a bottom surface of the shallow trench isolation region is coplanar with a bottom surface of the dielectric structure.

19. The method of claim 13, wherein forming the first nanosheet transistor includes:
   forming a first source/drain region of the first nanosheet transistor; and
   forming a source/drain contact of the first nanosheet transistor below the first source/drain region and having bottom surface that is coplanar with a bottom surface of the dielectric fin structure.

20. The method of claim 13, wherein the dielectric structure includes SiOCN.

* * * * *